US012314207B2

(12) United States Patent
Cote et al.

(10) Patent No.: US 12,314,207 B2
(45) Date of Patent: May 27, 2025

(54) HIGH BANDWIDTH IJTAG THROUGH HIGH SPEED PARALLEL BUS

(71) Applicant: Siemens Industry Software Inc., Plano, TX (US)

(72) Inventors: Jean-Francois Cote, Davie, FL (US); Jan Burchard, Wilsonville, OR (US); Jonathan Gaudet, Gatineau (CA)

(73) Assignee: Siemens Industry Software Inc., Plano, TX (US)

( * ) Notice: Subject to any disclaimer, the term of this patent is extended or adjusted under 35 U.S.C. 154(b) by 91 days.

(21) Appl. No.: 18/040,909

(22) PCT Filed: Jun. 24, 2021

(86) PCT No.: PCT/US2021/038797
§ 371 (c)(1),
(2) Date: Feb. 7, 2023

(87) PCT Pub. No.: WO2022/039831
PCT Pub. Date: Feb. 24, 2022

(65) Prior Publication Data
US 2023/0297534 A1 Sep. 21, 2023

Related U.S. Application Data

(60) Provisional application No. 63/067,534, filed on Aug. 19, 2020.

(51) Int. Cl.
*G06F 13/42* (2006.01)
*G06F 13/40* (2006.01)
*H04L 41/0893* (2022.01)

(52) U.S. Cl.
CPC ...... *G06F 13/4204* (2013.01); *G06F 13/4022* (2013.01); *G06F 13/4068* (2013.01); *G06F 13/4282* (2013.01); *H04L 41/0893* (2013.01)

(58) Field of Classification Search
None
See application file for complete search history.

(56) References Cited

U.S. PATENT DOCUMENTS

| 6,425,101 | B1* | 7/2002 | Garreau | G01R 31/318558 714/727 |
|---|---|---|---|---|
| 10,473,721 | B1 | 11/2019 | Cote et al. | |

(Continued)

FOREIGN PATENT DOCUMENTS

| DE | 19943941 A1 | 5/2000 |
|---|---|---|
| JP | 2000148528 A | 5/2000 |

OTHER PUBLICATIONS

J. Gaudet et al., "High-Bandwidth IJTAG over SSN," 2024 IEEE International Test Conference (ITC), San Diego, CA, USA, 2024, pp. 167-176, doi: 10.1109/ITC51657.2024.00036. (Year: 2024).*

(Continued)

*Primary Examiner* — Farley Abad
*Assistant Examiner* — Dayton Lewis-Taylor

(57) ABSTRACT

High Bandwidth IJTAG Through High Speed Parallel Bus A system in a circuit comprises: a first network (710) configurable to transmit data in parallel in the circuit, the first network (710) comprising circuit block interface devices, each of the circuit block interface devices being coupled to ports of one of circuit blocks in the circuit; a plurality of second networks (720, 725, 727), each of the plurality of second networks (720, 725, 727) configurable to transmit data in serial in one of the circuit blocks in the circuit; a third network (730) configurable to transmit data in serial in the circuit when being coupled to the plurality of second networks (720, 725, 727); and a plurality of network switching interface devices (740, 745, 747), each of the plurality of network switching interface devices (740, 745, 747) configurable to couple either the first network (710) or the third network (730) to one of the plurality of second networks (Continued)

(720, 725, 727) based on a control signal stored in the each of the plurality of interface devices (740, 745, 747).

25 Claims, 18 Drawing Sheets

(56) References Cited

U.S. PATENT DOCUMENTS 10,476,740 B1    11/2019  Cote et al.
10,996,271 B1 *  5/2021  Weinraub ........... G01R 31/2851

OTHER PUBLICATIONS

Milind Sonawane, et al., "Flexible Scan Interface Architecture for Complex SoCs," IEEE VLSI Test Symposium, 2016, 6 pgs.

IEEE Standard for Access and Control of Instrumentation Embedded within a Semiconductor Device Sponsored by the Test Technology Standards Committee; IEEE Computer Society; Piscataway, NJ, USA; Dec. 5, 2014 (Dec. 5, 2014), pp. 1-283, New York, USA.

Grady Giles, et al., "Test Access Mechanism for Multiple Identical Cores," IEEE International Test Conference, 2008, pp. 1-10, Austin and Sunnyvale, USA.

Amit Sanghani, et al., "Design and Implementation of a Time-Division Multiplexing Scan Architecture Using Serializer and Deserializer in GPU Chips," IEEE VLSI Test Symposium, 2011, pp. 219-224, California, USA.

"High Bandwidth DFT Fabric Requirements for Server and Microserver SoCs," IEEE International Test Conference, 2015, 10 pgs.

* cited by examiner

Table 1200

| CLK | 0 | 1 | 2 | 3 | 4 | 5 | 6 | 7 | 8 | 9 | 10 | 11 | 12 | 13 | 14 | 15 | 16 | 17 | 18 |
|---|---|---|---|---|---|---|---|---|---|---|---|---|---|---|---|---|---|---|---|
| TMS | 0 | 1 | 0 | 0 | 0 | 0 | 0 | 0 | 0 | 1 | 1 | 1 | 0 | 0 | 0 | 0 | 0 | 0 | 0 |
| L1 - 0 | | | | | S0 | S1 | S2 | S3 | S4 | S5 | | | | | S0 | S1 | S2 | S3 | S4 |
| DR1 | | | | | C5<br>C4 | S0<br>C5 | S1<br>S0 | S2<br>S1 | S3<br>S2 | S4<br>S3 | S5<br>S4 | S5<br>S4 | S5<br>S4 | S5<br>S4 | S5<br>S4 | S5<br>S4 | S5<br>S4 | S5<br>S4 | S5<br>S4 |
| R1 | | | | | | | | | C3<br>C2 | C4<br>C3 | C5<br>C4 | S0<br>C5 | S1<br>S0 | S2<br>S1 | S3<br>S2 | S3<br>S2 | S3<br>S2 | S3<br>S2 | S3<br>S2 |
| DR2 | | | | | | | | | | | C1<br>C0 | C2<br>C1 | C3<br>C2 | C4<br>C3 | C5<br>C4 | S0<br>C5 | S1<br>S0 | S3<br>S2 | S3<br>S2 |
| R2 | | | | | | | | | | | | | | | C5<br>C4 | S0<br>C5 | S1<br>S0 | S1<br>S0 | S1<br>S0 |
| DR3 | | | | | | | | | | | | C0 | C1 | C2 | C3 | C4 | C5 | | |
| R3 | | | | | | | | | | | | | | | | | C5 | x | |
| L1 - 7 | | | | | | | | | | | | | | | | | | S1<br>S0 | S1<br>S0 |

CLK: clock cycle    TMS: TMS bit at bottom cell    L1 - 0: bit at bottom cell of channel 1050    L1 - 7: bit at top cell of channel 1050

DR1: bits shifted into shift element 1025    R1: bits latched into storage element 1027    DR3: bits shifted into shift element 1045

DR2: bits shifted into shift element 1035    R2: bits latched into storage element 1037    R3: bits latched into storage element 1047

FIG. 12

1710: Transmitting network configuration data using a third network being coupled to a plurality of second networks, the third network configured to transmit data in serial in the circuit, each of the plurality of second networks configured to transmit data in one of circuit blocks in the circuit

1720: Transmitting setup data using a first network being coupled to the plurality of second networks, the first network configured to transmit data in parallel in the circuit

1730: Transmitting interface enabling data using the third network being coupled to the plurality of second networks to enable interface devices between the first network and the circuit blocks

1740: Transmitting test data to the circuit blocks using the first network

Flow chart
1700

FIG. 17

HIGH BANDWIDTH IJTAG THROUGH HIGH SPEED PARALLEL BUS

RELATED APPLICATIONS

This application claims the benefit of U.S. Provisional Patent Application No. 63/067,534, filed on Aug. 19, 2020, and naming Jean-Francois Cote et al. as inventors, which application is incorporated entirely herein by reference.

FIELD OF THE DISCLOSED TECHNOLOGY

The presently disclosed technology relates to the field of integrated circuit design, verification, manufacture and test. Various implementations of the disclosed technology may be particularly useful for increasing bandwidth of serial networks in a circuit.

BACKGROUND OF THE DISCLOSED TECHNOLOGY

The number of functional units in semiconductor devices continues to increase significantly as the integration of functionality into a single semiconductor device continues. A functional unit may be a sensor for temperature or voltage, a clock controlling circuitry such as phase-locked loops (PLLs), a scan configuration controller, or an entire Built-In Self-Test (BIST) engine for memory or logic testing. Accessing, controlling, observing, or in more general terms "operating", a large number of these functional units presents a challenge to designers.

Traditionally, functional units are daisy-chained in a single, serial access network. This leads to numerous scan operations for shifting data bits into and out from these functional blocks. To reduce the access time, reconfigurable scan networks can be employed to replace the traditional serial access networks. Based on certain programming operations of special elements of the access network, parts of a reconfigurable scan network can go in and out of the scan path. A typical reconfigurable scan networks, conforming to IEEE 1687-2014 and IEEE 1149.1-2013, is referred to as an IJTAG network.

Being dynamically reconfigurable, an IJTAG network can minimize the number of shift operations needed for operating the desired functional units such as setting up all aspects of test modes of a circuit. As the complexity of the devices increases and the amount of diagnostic data needed to be extracted grows, the low speed and serial nature of the IJTAG scan network is becoming a bottleneck and making test time grow.

Attempts have been made to increase the speed of shift by introducing clock gaps around the transition of the controls (clock stretching) or by adding pipeline stages on the control signals with matching stages on the scan path. Unfortunately, those two techniques are mutually exclusive. While these solutions may help reach shift speeds in the low 100 MHz range, the increased bandwidth is still orders of magnitude lower than it needs to be because of the serial nature of the solution and the two edge timing used when crossing clock domains.

The IEEE1687-2014 standard support using multi-chain scan interfaces but routing many scan chains across physical block boundary is costly and very messy and incompatible with modern core-based design flows.

BRIEF SUMMARY OF THE DISCLOSED TECHNOLOGY

Various aspects of the disclosed technology relate to increasing bandwidth of serial networks. In one aspect, there is a system in a circuit, comprising: a first network configurable to transmit data in parallel in the circuit, the first network comprising circuit block interface devices, each of the circuit block interface devices being coupled to ports of one of circuit blocks in the circuit; a plurality of second networks, each of the plurality of second networks configurable to transmit data in serial in one of the circuit blocks in the circuit; a third network configurable to transmit data in serial in the circuit when being coupled to the plurality of second networks; and a plurality of network switching interface devices, each of the plurality of network switching interface devices configurable to couple either the first network or the third network to one of the plurality of second networks based on a control signal stored in the each of the plurality of interface devices.

The control signal stored in the each of the plurality of interface devices can be updated using either the third network when the third network is coupled to the one of the plurality of second networks or the first network when the first network is coupled to the one of the plurality of second networks.

The plurality of second networks may be configurable to be coupled to the first network in a daisy chain mode, a parallel mode, a broadcast mode, or any combination thereof.

The first network may operate at a clock frequency being a multiple (greater than 1) of a clock frequency at which the plurality of second networks operates, and the plurality of second networks may be coupled to the first network in a time slot multiplexing mode.

A second network in the plurality of second networks may comprise a section configurable to transmit data in parallel which is configurable to be coupled to the first network in parallel.

One or more second networks in the plurality of second networks may employ a clock stretching technique for increasing the shift speed.

The third network and the plurality of second networks may conform to the IEEE 1687 standard (IJTAG, Internal Joint Test Action Group).

The first network may further comprise multiplexing devices, pipeline devices, or both, the multiplexing devices configurable to change a data streaming path of the first network based on another control data deliverable to the multiplexing devices through the plurality of second networks being coupled to either the first network or the third network.

Each of the plurality of second networks may comprise a configuration interface device, the configuration interface device being coupled to one of the circuit block interface devices, configuration data for the configuration interface device deliverable through the each of the plurality of second networks being coupled to either the first network or the third network, the configuration data comprising data for determining whether or not a circuit block interface device in the circuit block interface devices is activated and data for determining which part of the data transmitted in the first network to be captured, replaced, or captured and replaced by each of the circuit block interface devices activated.

The circuit block interface devices may comprise registers and clock signal generation logic, and the first network comprises data channels and is configurable to transmit a plurality of data packets consecutively, each of the plurality of data packets having a plurality of bits, each of the plurality of bits being assigned to one of the circuit blocks in which the circuit block interface device is activated, a number of the plurality of bits being equal to or greater than a number of the data channels used for the transmitting the plurality of data packets. Each of the plurality of data packets may comprise one or more bits of a test pattern or a compressed test pattern for testing one or more of the circuit blocks, the clock signal generation logic in a circuit block interface device coupled to ports of one of the circuit blocks may be configurable to generate clock signals for scan-based testing, and the ports of the one of the circuit blocks may comprise inputs and outputs of scan chains, inputs and outputs of one or more test controllers, or a combination thereof, each of the one or more test controllers comprising a decompressor and a compactor.

In another aspect, there are one or more non-transitory computer-readable media storing computer-executable instructions for causing a computer to perform a method, the method comprising: generating the above system in a circuit design.

In still another aspect, there is a method for testing a circuit, comprising: transmitting network configuration data via a third network being coupled to a plurality of second networks, the third network configured to transmit data in serial in the circuit, each of the plurality of second networks configured to transmit data in one of circuit blocks in the circuit, the network configuration data comprising first network switching interface control data for a plurality of network switching interface devices, the first network switching interface control data enabling each of the plurality of network switching interface devices to decouple one of the plurality of second networks from the third network and to couple the one of the plurality of second networks to a first network, the first network configured to transmit data in parallel in the circuit; transmitting setup data via the first network being coupled to the plurality of second networks, the setup data comprising test setup data for the circuit blocks, network setup data for communication between the first network and the circuit blocks, and second network switching interface control data for the plurality of network switching interface devices, the second network switching interface control data enabling each of the plurality of network switching interface devices to decouple one of the plurality of second networks from the first network and to couple the one of the plurality of second networks to the third network; and transmitting test data to the circuit blocks via the first network.

The method may further comprise: transmitting interface enabling data via the third network being coupled to the plurality of second networks to enable interface devices between the first network and the circuit blocks before the transmitting test data.

The network configuration data may further comprise network reconfiguration data for a plurality of multiplexing devices, the network reconfiguration data causing the first network to bypass zero, one, or more of the circuit blocks.

Certain inventive aspects are set out in the accompanying independent and dependent claims. Features from the dependent claims may be combined with features of the independent claims and with features of other dependent claims as appropriate and not merely as explicitly set out in the claims.

Certain objects and advantages of various inventive aspects have been described herein above. Of course, it is to be understood that not necessarily all such objects or advantages may be achieved in accordance with any particular embodiment of the disclose technology. Thus, for example, those skilled in the art will recognize that the disclose technology may be embodied or carried out in a manner that achieves or optimizes one advantage or group of advantages as taught herein without necessarily achieving other objects or advantages as may be taught or suggested herein.

BRIEF DESCRIPTION OF THE DRAWINGS

FIG. 12 illustrates a table describing an example of bits in some of the scan/storage elements in FIG. 10 at 19 consecutive clock cycles.

FIG. 17 illustrates a flowchart showing a process of setting up a circuit test via a high-bandwidth serial network enabled by a data streaming network that may be implemented according to various examples of the disclosed technology.

DETAILED DESCRIPTION OF THE DISCLOSED TECHNOLOGY

General Considerations

Various aspects of the disclosed technology relate to increasing bandwidth of serial networks in a circuit. In the following description, numerous details are set forth for the purpose of explanation. However, one of ordinary skill in the art will realize that the disclosed technology may be practiced without the use of these specific details. In other instances, well-known features have not been described in detail to avoid obscuring the presently disclosed technology.

The detailed description of a method or a device sometimes uses terms like "transmit" and "enable" to describe the disclosed method or the device function/structure. Such terms are high-level abstractions. The actual operations or functions/structures that correspond to these terms will vary depending on the particular implementation and are readily discernible by one of ordinary skill in the art. It should also be appreciated by one of ordinary skill in the art that the term "coupled" means "connected directly or indirectly."

Although the operations of the disclosed methods are described in a particular sequential order for convenient presentation, it should be understood that this manner of description encompasses rearrangements, unless a particular ordering is required by specific language set forth below. For example, operations described sequentially may in some cases be rearranged or performed concurrently. Moreover, for the sake of simplicity, the disclosed flow charts and block diagrams typically do not show the various ways in which particular methods can be used in conjunction with other methods.

Reconfigurable Scan Networks

Figure 1:
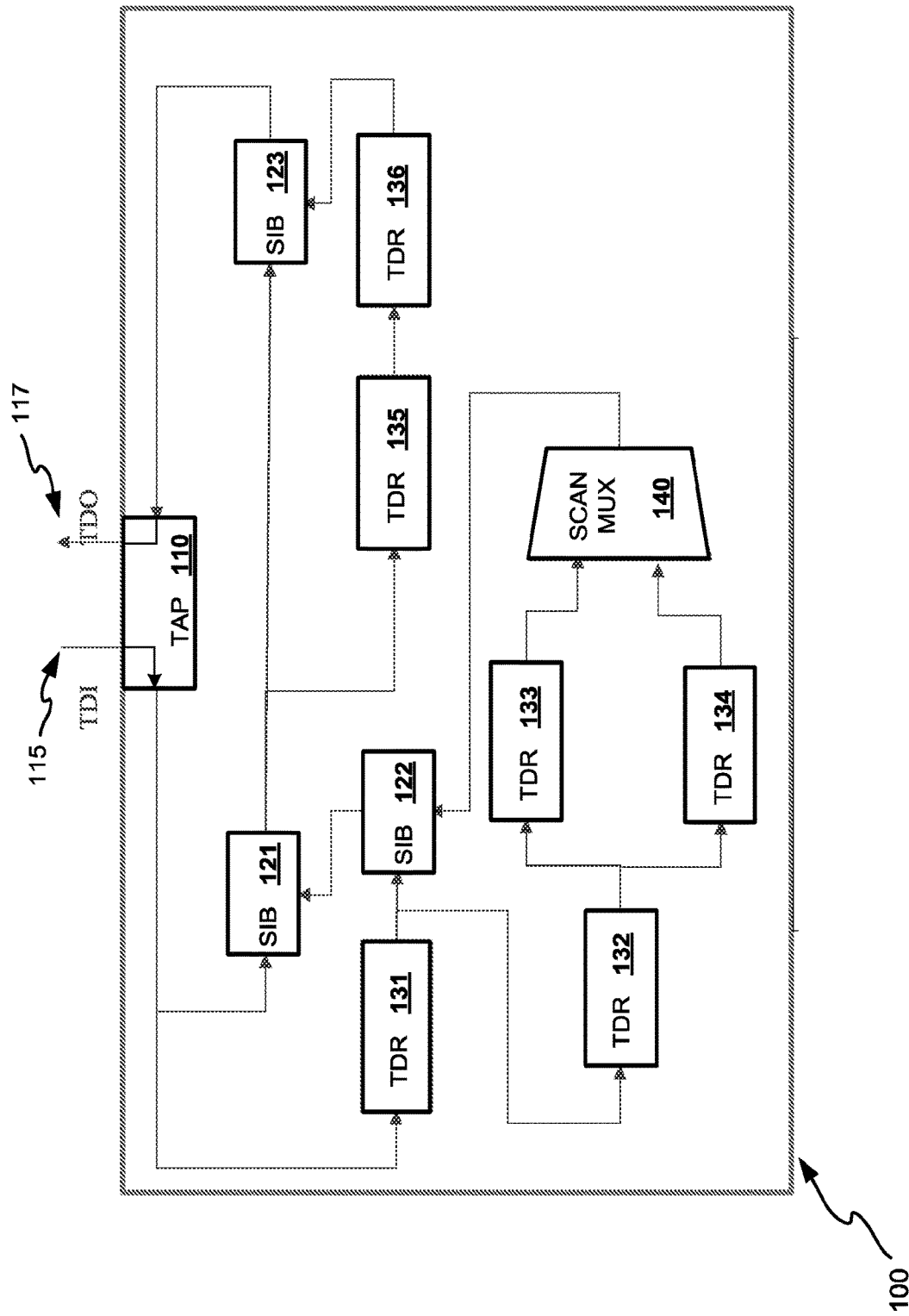
FIG. 1 illustrates an example of an IJTAG network.

A reconfigurable scan network conforming to IEEE 1687-2014 (IJTAG) provides, among other things, access to embedded test and test setup for manufacturing test. FIG. 1 illustrates an example of an IJTAG network 100. In the IJTAG network 100, a SIB (Segment Insertion Bit) 123 switches between two different access paths between a TDI (Test Data In) port 115 and a TDO (Test Data Out) port 117, which both belong to a TAP (Test Access Port) 110. The shorter access path directly connects the SIB 123 to a SIB 121 while the longer access path connects the SIB 123 to the SIB 121 through two TDRs (Test Data Registers) 135 and 136. A ScanMux (multiplexer) 140 selects one of two scan segments of the access network 100 (one through TDR 133 and the other through TDR 134) based on control data received. For these two scan segments to be accessed, SIBs 121 and 122 need to be programmed accordingly. A scan path can also bypass TDRs 132, 133 and 134 and reach the SIB 122 directly from TDR 131.

As FIG. 1 shows, programmable components of a reconfigurable scan network such as the SIBs 121, 122 and 123 and the ScanMux 140 in the scan network 100 allow dynamic configuration of the access network to bring a specific functional block into the scope of the access network. These programmable components can be programmed by shifting configuration data into the shift flip-flops of the control register and latching the shifted bits into the parallel latches in them. The functional blocks of the circuit are controlled by the TDRs 131-136. This dynamic access network configuration minimizes the number of shift operations needed for operating the desired functional block(s).

Additional advantages of such reconfigurable scan networks are derived from the ability to configure the access network according to power and clock domains. For example, placing a SIB in front of a power domain allows the part of the access network outside of this power domain remains operational when the power domain is switched off. In a similar way, hierarchical design entities can be taken in and out of the scope of the access network, enabling the bypass of every functional object within the respective design hierarchy entity.

Data Streaming Networks

With integrated circuits growing to include billions of transistors in some instances, it is virtually impossible to design them flat with no partitioning. Electronic Design Automation (EDA) tools would not be able to process them efficiently. Additionally, there is significant reuse of Intellectual Property (IP) from one design to another. Large designs, known as Systems-On-A-Chip (SOCs), include a large number of "cores" that are used as building blocks (also referred to circuit blocks). Each core is usually designed and validated individually first, then integrated with other cores to form the entire SOC. This is known as hierarchical design. Ideally, as much of the design and validation work is done at the core level, which is smaller and more manageable, leaving the integration and chip-level validation to be done at the top level. All work done at the core level can also be done earlier when working on the core, and moved out of the critical path when the SOC comes together closer to the tape-out deadline.

As designs have grown, the number of levels of core hierarchy has grown as well. Hierarchical design started with two levels of hierarchy: The core level and the chip/top level. Increasingly, cores are first integrated into larger sized cores or sub-systems, then integrated into the chip. This represents three levels of core hierarchy. Some large designs can have even more levels of core hierarchy.

Just as designs adopt hierarchical design to manage complexity, so has scan test. In hierarchical test methodologies, the scan chains and compression logic are inserted into every core. The test patterns are generated and validated at the core level to test most of the logic in the core. Subsequently, the patterns from multiple cores are retargeted or mapped to the top level. They are also merged with retargeted patterns for other cores to be tested at the same time. In addition to retargeting patterns generated for testing most of the content of each core, test pattern generation is also run at the next level up to test peripheral logic between the cores as well as logic at that level that is involved in integrating the cores. If this higher level is not the chip level, then those patterns will also have to be retargeted to the chip level.

The same test pattern generation and retargeting methodology is applied recursively regardless of the levels of hierarchy, but the planning and design of design for test (DFT) gets more complex with additional levels of hierarchy when using conventional scan access methods.

Planning and implementing hierarchical scan test in SOCs has several challenges, most related to providing access to scan channels in the cores. A scan channel is a channel connecting to inputs/outputs of scan chains, inputs/outputs of test controllers for test compression, or a combination thereof. When retargeting and merging core-level patterns to the top level, usually a subset of cores are tested at any given time due to two reasons: First, the power dissipation may not allow all cores to be tested concurrently; and second, the limited number of chip-level Inputs/Outputs (I/Os, or ports) does not allow all core-level channels to be accessed simultaneously.

For any group of cores that are to be tested concurrently, their channel inputs and outputs need to be connected to different chip-level I/Os when employing the conventional point-to-point scan access methods (sometimes referred to as star or switch topologies). Since there are usually more core-level channels that chip-level I/Os available for scan, the pin availability limits the number of cores that can be tested concurrently, and increases the number of groups (test sessions). Each top-level I/O can connect to a different core-level pin in each group. With the number of cores growing and the number of chip-level I/Os available for scan test diminishing, fewer and fewer cores can be accessed directly from chip-level I/Os and tested concurrently.

A relatively recent trend in SOC design, referred to as tile-based layout, is adding further complexity and constraints to DFT architectures. In tile-based designs, virtually all logic and routing is done within the cores and not at the top level. The cores abut one another when integrated into the chip with connections flowing from one core to the next. Any connectivity between cores has to flow through cores that are between them. Logic that is logically at the top level has to be pushed into the cores and designed as part of the cores.

A general packet-based core access architecture has been proposed to overcome the test access challenges. In this architecture, each parallel word includes the address of the core (or core group) the information is destined for, an opcode indicating what to do with that data, and the actual payload. This architecture can work for both heterogeneous and identical cores. For identical cores, it supports efficient broadcast of stimuli and expected values (good-machine responses), on-chip comparison, and accumulation of pass/fail data such that multiple identical cores could be tested in near constant time. This architecture, however, is not efficient due to its significant overhead in every parallel word. Information that is not the payload, namely the address and opcode, occupies certain number of bits. A very narrow bus would not be able to support this architecture.

Figure 2:
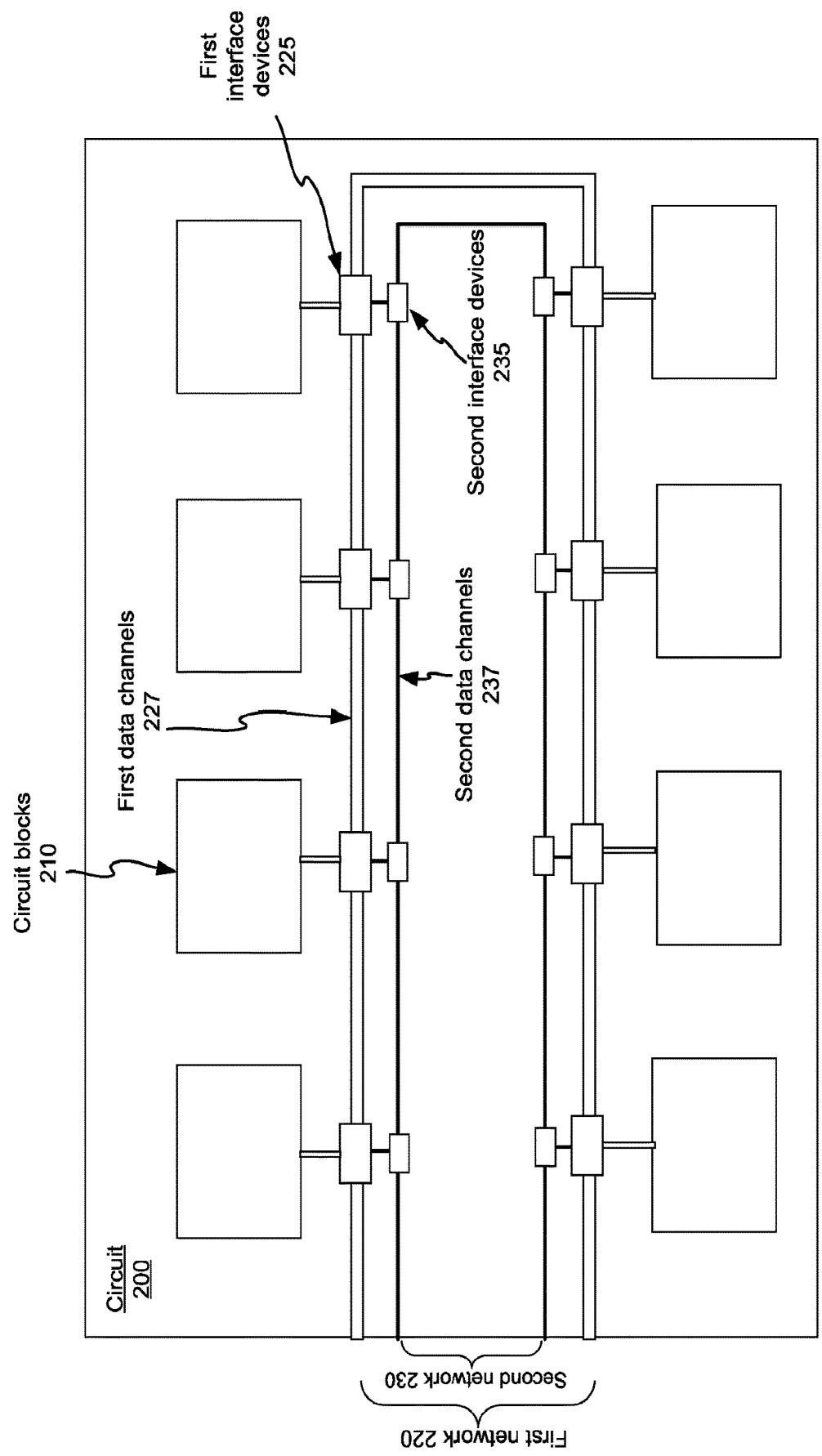
FIG. 2 illustrates an example of a data streaming system in a circuit, in which a serial network is used for setting up core interfaces for communications with a parallel data streaming network.

Another packet-based core access architecture reserves streamed packets all for the actual payload, and employs a separate serial network for setting up core interfaces for communications with the parallel data streaming network. FIG. 2 illustrates an example of such a data streaming system 200 in a circuit. The data streaming system 200 comprises a first network 220 and a second network 230. The first network 220 comprises first data channels 227 (first data bus) and first interface devices 225 (also referred to as circuit block interface devices). The second network 230 comprises one or more second data channels 237 (second data bus) and second interface devices 235. The first interface devices 225 comprises registers and clock signal generation logic. Each of the first interface devices 225 is coupled to ports of one of circuit blocks 210 in the circuit 200. Each of the first interface devices 225 is also coupled to one of the second interface devices 235. Inputs and outputs of the first data channels 227 can be connected to some chip-level I/Os (the GPIO pads). Inputs and outputs of the one or more second data channels 237 can also be connected to some other chip-level I/Os (the GPIO pads). While only one first network 220 and one second network 230 are shown in FIG. 2, a circuit can have multiple first networks 220 and one or more second networks 230.

The first data channels in the first network 220 can be formed by chains of flip-flops, acting as pipeline stages. Some of these flip-flops are in the first interface devices 225. The first network 220 is configurable to transmit a plurality of data packets consecutively. Each of the plurality of data packets has m bits, and each of the m bits is assigned to one of the circuit blocks 210 preconfigured in an active mode. The second network 230 is configurable to transmit configuration data to the first interface devices. The configuration data comprise data for determining whether or not a first interface device in the first interface devices 230 is activated and data for determining which bit or bits of each of the plurality of data packets to be captured, replaced, or captured and replaced by each of the first interface devices activated. The second network 230 may conform to the IEEE 1687 standard (IJTAG, Internal Joint Test Action Group).

The active mode of a circuitry block may be a mode for testing or a mode for loading/unloading data. Here m is equal to or greater than a number of the first data channels 225 used for the transporting the plurality of data packets. While the total number of the first data channels for a manufactured circuit is typically fixed, the number of the first data channels used for the transporting the plurality of data packets may be less than the total number. For example, a setup for wafer testing may not need all of the first data channels 225 while a setup for testing the same circuit in a system may take advantage of all of the first data channels 225.

Assume that the number of first data channels used for the transporting data packets is n. The first network 220 transports the data packets at a rate of one n-bit word per clock cycle, and if m is greater than n, the bit assignment to the circuit blocks 210 in the active mode for a particular n-bit word (bus word) repeats every $LCM(m,n)/n$ clock cycles according to various embodiments of the disclosed technology. Here, $LCM(m,n)$ is the least common multiple of m and n. In some bit assignments, bits in each of the plurality of data packets are divided into bit blocks, bits in each of the bit blocks are next to each other except bits at two ends of the block, and each of the bit blocks is assigned to one of the circuit blocks preconfigured in the active mode. Each of the first interface devices activated can be configured to keep track of the location of its data bits in each of the bus words.

Figure 3:
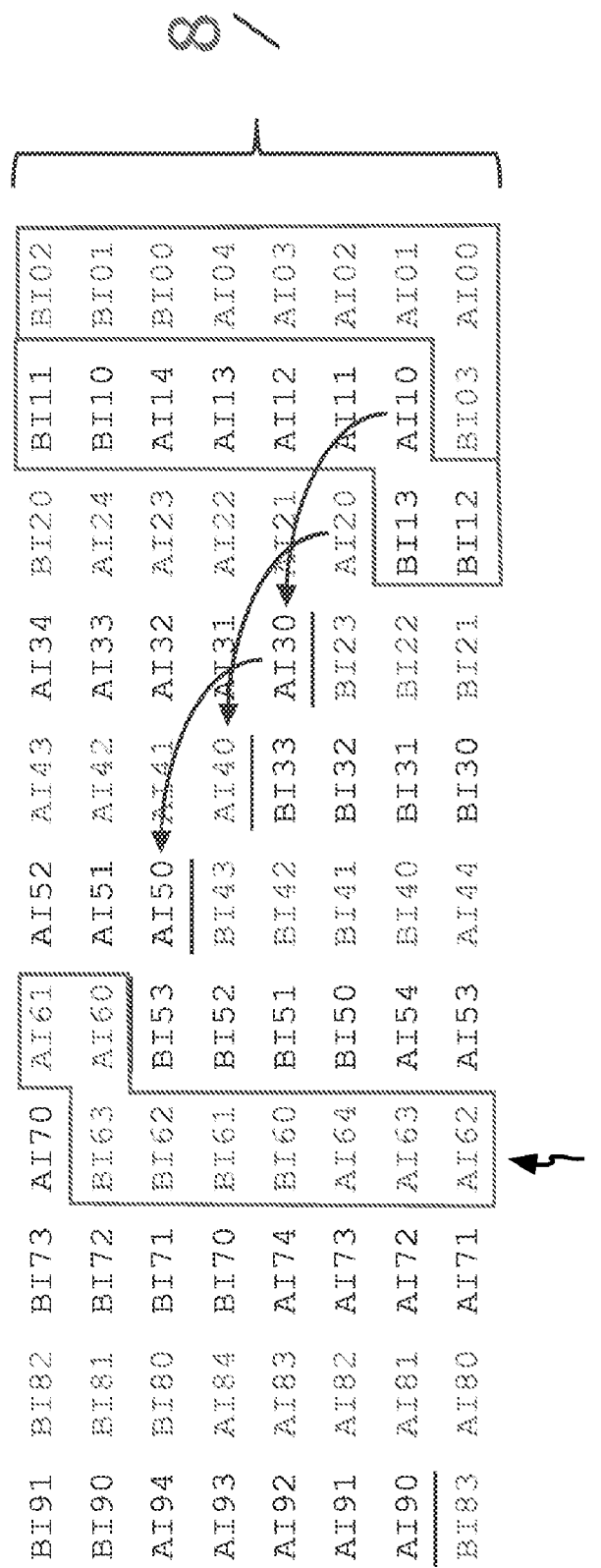
FIG. 3 illustrates an example of bit assignment for data channels of the parallel data streaming network in FIG. 2.

FIG. 3 illustrates an example of bit assignment for the first data channels 225 used for transporting data packets. In this example, two circuit blocks (core A and core B) are being driven through the first network—exchanging data with the first network. One of them loads/unloads four bits per shift cycle of the circuit block, while the other loads/unloads five bits. The size of each data packet is therefore nine bits. In the figure, "AI" means data bits for the core A and "BI" means data bits for the core B. For the two circuit blocks to shift once, nine bits (m=9) have to be delivered. The number of the first data channels used for data streaming is eight, i.e., the bus for delivering the data is eight bits wide (n=8). The locations of the 9-bit packets within each 8-bit bus word thus rotate with each packet to use every bit of every bus word without using wasteful padding. As a result, the packet starts at the same bus bit position every nine clock cycles, i.e., repeating the same bit assignment every nine clock cycles. Further, each data packet is divided into two bit blocks. A data packet 310 in FIG. 3, for example, is divided into a bit block consisting of AI64-AI60 and a bit block consisting of BI60-BI63.

A data packet can be as wide as needed, and can occupy as many bus words as needed. The internal channel requirements (9 bits in the example shown in FIG. 3) are decoupled from the available scan pins at the chip level (8×2 I/O for scan in this case). If the packet is wider than the bus and occupies multiple bus words, the circuit block can shift less often than once every bus shift cycle but it will be possible to drive all the circuit blocks needed. Because the scan bus can usually shift data at a higher rate than the circuit blocks can shift internally, it can be possible to keep the circuit blocks shifting at their maximum rates even if they do not shift every bus clock cycle. The bus (the first data channels) can be re-programmed to reduce its active width such that it does not exceed the number of bits in a packet when the packet size (m) is less than the physical bus width (n).

A system for streaming data in a circuit that is implemented according to various embodiments of the disclosed technology may be used to deliver different types of data in the circuit such as data to be stored in memory circuitry and data for circuit testing. As noted previously, hierarchical design is used extensively nowadays. Packet-based streaming based on the disclosed technology can greatly improve test efficiency and flexibility for SOC designs. For testing one or more of the circuit blocks, each data packet comprises one or more bits of a test pattern or a compressed test pattern. Bits of multiple test patterns for testing different circuit blocks can be contained in each data packet as illustrated in FIG. 3.

Figure 4:
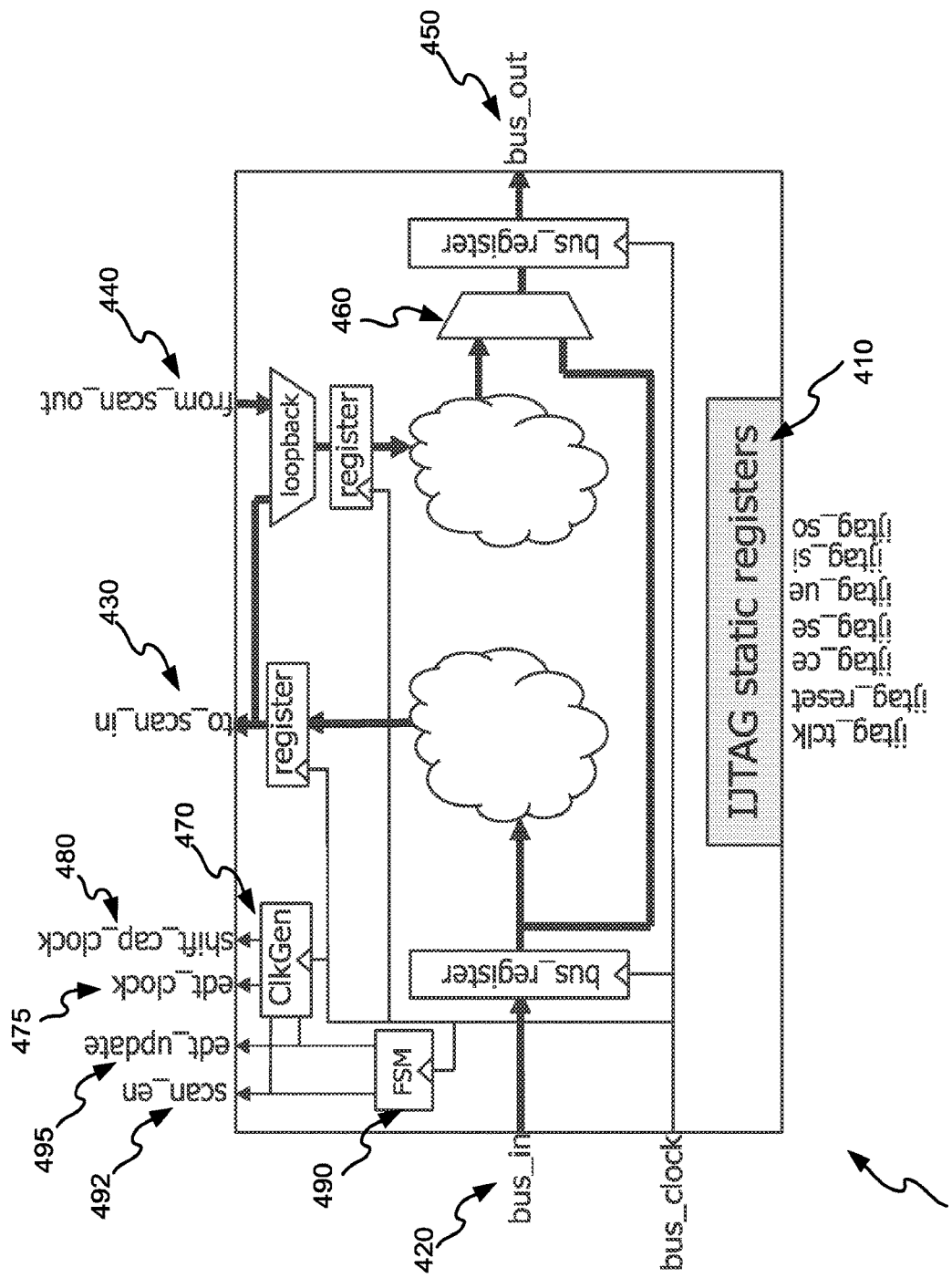
FIG. 4 illustrates an example of a circuit block interface device such as the first interface device in FIG. 2 that may be implemented according to various embodiments of the disclosed technology.

FIG. 4 illustrates an example of a first interface device (circuit block interface device) 400. The first interface device 400 has multiple static registers 410, labelled as IJTAG static registers. The multiple static registers 410 are programmed (configured) prior to the start of the streaming. IJTAG or other access mechanism may be used for delivering data for programing. If the interface device 400 is activated, bits in the bus word received from bus_in 420 will be selected and delivered to scan_in ports 430 while bits received from scan_out ports 440 will be added to the bus word before the bus word is transported out through bus_out 450 of the interface device 400. Because the data bits within a word that belong to a given core can rotate when the packet width is not a multiple of the bus width, the interface device 400 may use shifters to access the right bits. Additionally, since the bits within a packet that go to a core can be spread across multiple bus words, the data may have to be collected across multiple bus clock cycles before one shift cycle within the core can occur. The same can happen for the unloaded data. The data unloaded from one cycle of the core is to be inserted into a packet. That data can occupy part of a bus word, a whole bus word, or bits spread across multiple bus words. The interface device 400 have clock generation circuitry 470 for generating edt_clock 475 and shift_cap_clock 480. A finite state machine 490 (FSM) is used to generate signals of scan_en 492 and edt_update 495. If the interface device 400 is not activated, the original bus word will bypass the internal logic and selected by a multiplexer 460 for output. As such, the interface device 400 acts as a pipeline stage within the first network.

Figure 5:
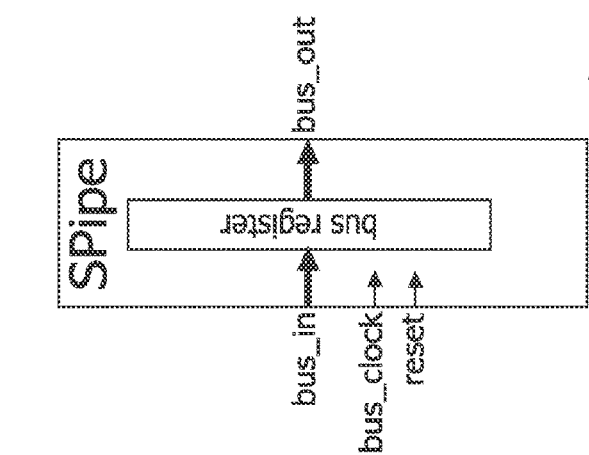
FIG. 5 illustrates an example of a pipeline device that may be implemented according to various embodiments of the disclosed technology.

Referring to FIG. 2, the first network 220 may further comprise multiplexing devices, pipeline devices or both. FIG. 5 illustrates an example of a pipeline device 500 that may be implemented according to various embodiments of the disclosed technology. The pipeline device 500 can be used to meet timing requirements. If there is a long route between two cores, or between cores and chip-level I/Os, the propagation delay through that route may impede the ability to operate the bus at a high frequency. To reducing the length of the route that the data propagates through within one cycle, one or more pipeline devices may be inserted. Once data starts propagating through the first network 220 and nodes in the network are filled with data, there is no loss of throughput due to the presence of additional nodes such as those pipeline stages. Their presence may slightly increase latency at the start of test application.

Figure 6:
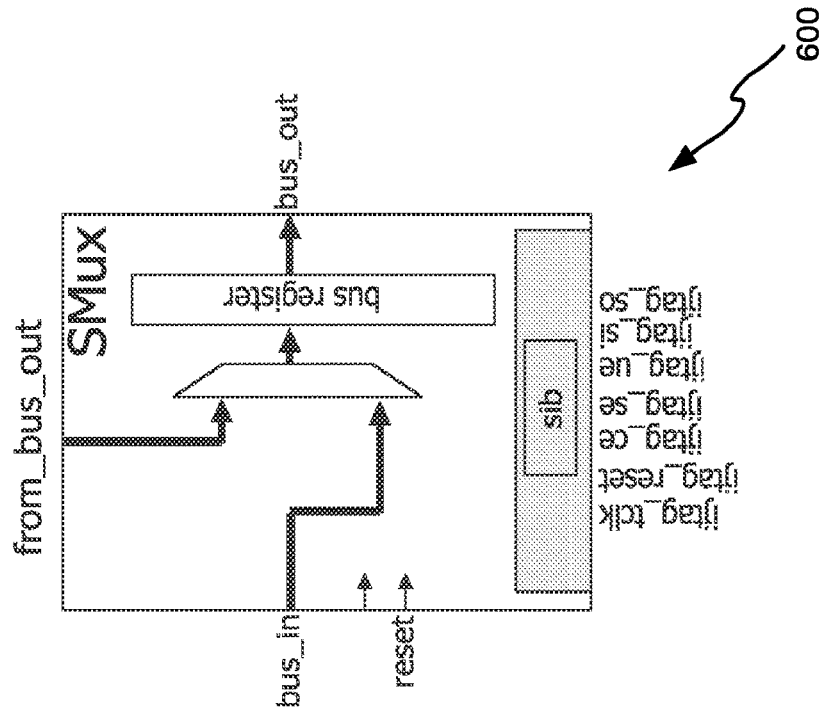
FIG. 6 illustrates an example of a multiplexing device that may be implemented according to various embodiments of the disclosed technology.

FIG. 6 illustrates an example of a multiplexing device 600 that may be implemented according to various embodiments of the disclosed technology. The multiplexing device 600 can select which of two preceding nodes to connect to its output. It can serve the same purpose as a Segment Insertion Bit (SIB) node does in the IJTAG standard. Such a node allows a portion of the network to be included in the network, or bypassed when inactive. This enables among others: 1) improving efficiency by bypassing a portion of the network when not being used; 2) improving operational flexibility by allowing, for example, cores including the inactive part of the network to be powered down without breaking the operation of the active portion of the network; 3) bypassing, without disabling the entire network, a portion of the network when there is a manufacturing defect in that portion of the network; and 4) linking different width sections of the network, allowing the use of the full wider width when the smaller width section is bypassed.

Figure 7:
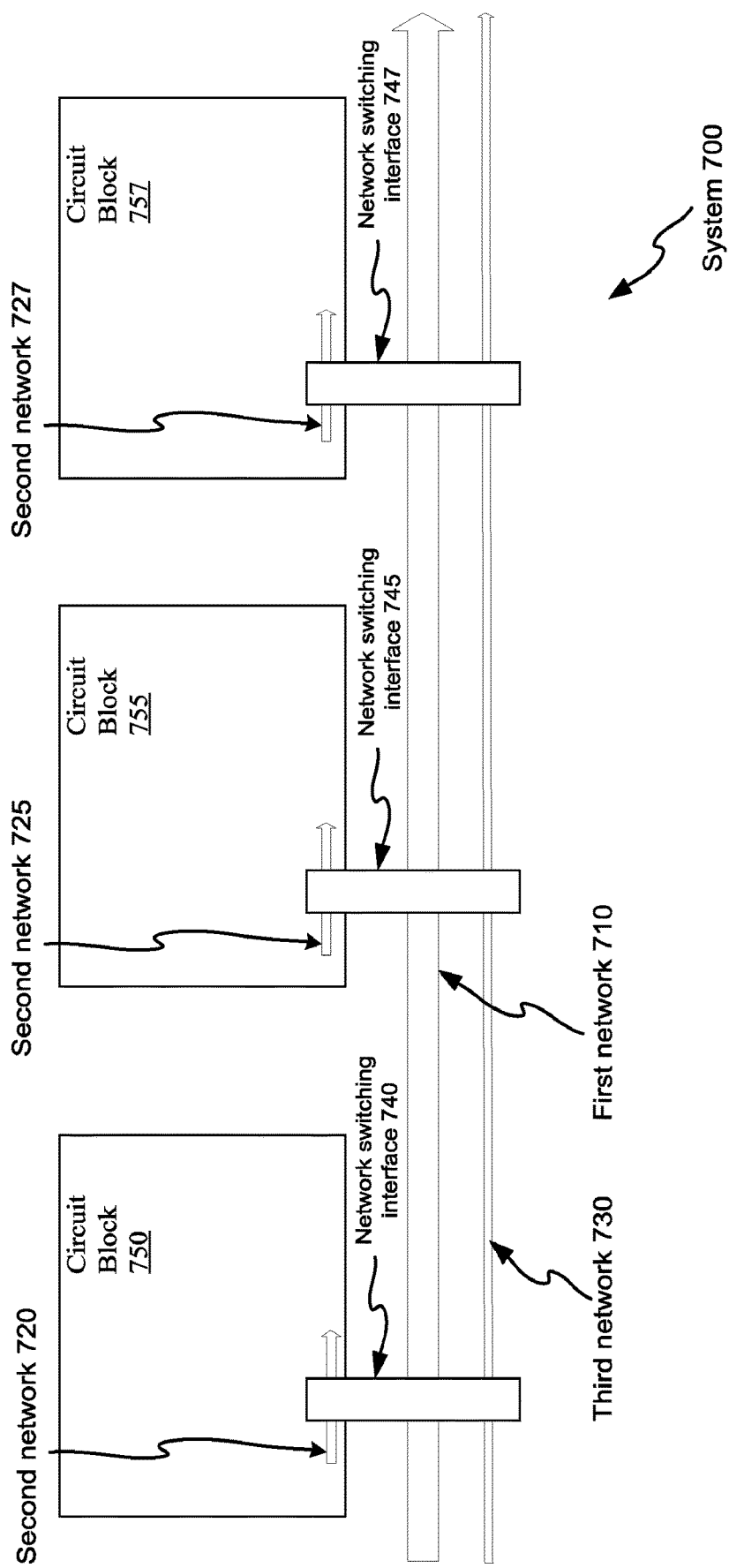
FIG. 7 illustrates an example of a system utilizing a data streaming network to increase serial network bandwidth that may be implemented according to various embodiments of the disclosed technology.

Architecture for Utilizing Data Streaming Network to Increase Serial Network Bandwidth FIG. 7 illustrates an example of a system 700 utilizing a data streaming network to increase serial network bandwidth that may be implemented according to various embodiments of the disclosed technology. The system 700 comprises a first network 710 (the data streaming network) configurable to transmit data in parallel in the circuit. The first network 710 comprises circuit block interface devices (not shown in the figure). Each of the circuit block interface devices is coupled to ports of one of circuit blocks in the circuit. FIG. 4 shows an example of the circuit block interface device. The first network 710 can be configured to transmit test data into and transmit test response data out of the circuit blocks via the circuit block interface devices. FIG. 7 shows that the circuit comprises three circuit blocks: a circuit block 750, a circuit block 755, and a circuit block 757.

The first network 710 may be implemented using the two packet-based core access systems discussed previously such as the data streaming system 200 shown in FIG. 2. Like the data streaming system 200, the first network 710 may be reconfigurable—capable of bypassing one or more circuit blocks for data streaming. To achieve configurability, devices like the multiplexing device 600 shown in FIG. 6 may be employed.

The system 700 also comprises a plurality of second networks including second networks 720, 725 and 727 and a third network 730. Each of the plurality of second networks is configurable to transmit data in serial in one of the circuit blocks in the circuit. As FIG. 7 shows, the second networks 720, 725 and 727 are located in the circuit blocks 750, 755 and 757, respectively. The third network 730 is configurable to transmit data in serial in the circuit while being coupled to the plurality of second networks. The plurality of second networks and the third network 730 may be reconfigurable. Conventionally, the second networks 720, 725 and 727 are permanently coupled to the third network 730 to form a single network which can be used for, for example, test setup. An example of such a network is an IJTAG network.

The system 700 further comprises a plurality of network switching interface devices such as network switching interface devices 740, 745 and 747 shown in FIG. 7. Each of the plurality of network switching interface devices is configurable to couple either the first network 710 or the third network 730 to one of the plurality of second networks based on a control signal stored in the each of the plurality of interface devices. For example, the network switching interface device 740 can allow the second network 720 to be coupled to either the first network 710 or the third network 730. The first network 710 is parallel in nature and may be able to operate at a much higher frequency than the serial network formed by a combination of the third network 730 and the plurality of second networks. Thus, the ability to couple the first network 710 to the second networks 720, 725 and 727 can significantly increase the bandwidth for transmitting data into and out of the circuit blocks 750, 755 and 757 for devices served by the second networks 720, 725 and 727.

Figure 8:
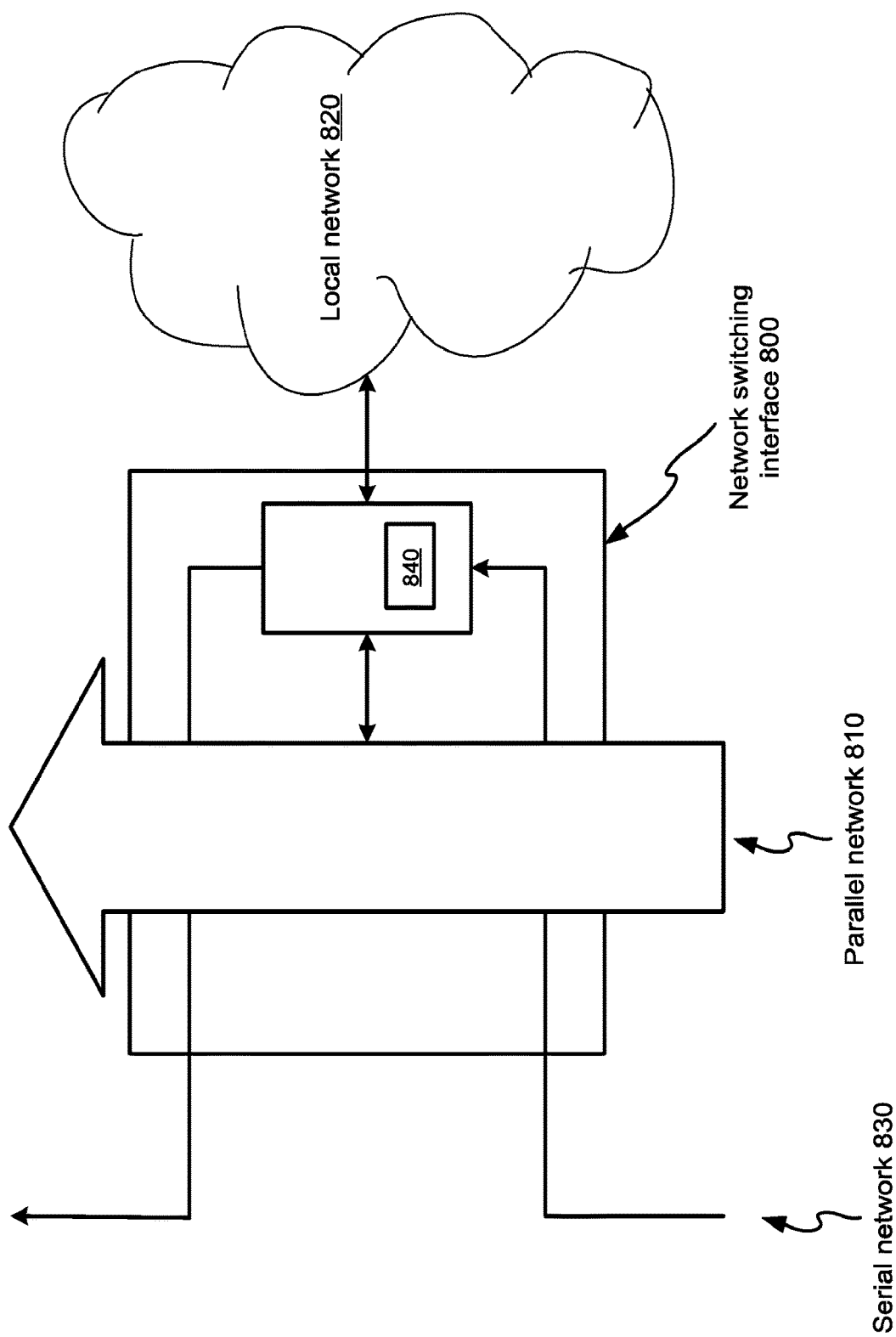
FIG. 8 illustrates an example of a network switching interface device according to various embodiments of the disclosed technology.

FIG. 8 illustrates an example of a network switching interface device 800 according to various embodiments of the disclosed technology. The network switching interface device 800 is configured to couple a local network 820 (second network) to either a serial network 830 (third network) or a parallel network 810 (first network) based on a control signal stored in a register 840. The control signal stored in the register 840 can be updated using either the serial network 830 when the serial network 830 is coupled to the local network 820 or the parallel network 810 when the parallel network 810 is coupled to the local network 820. As such, the access to the local network 820 via either the parallel network 810 or the serial network 830 can be changed dynamically.

Figure 9:
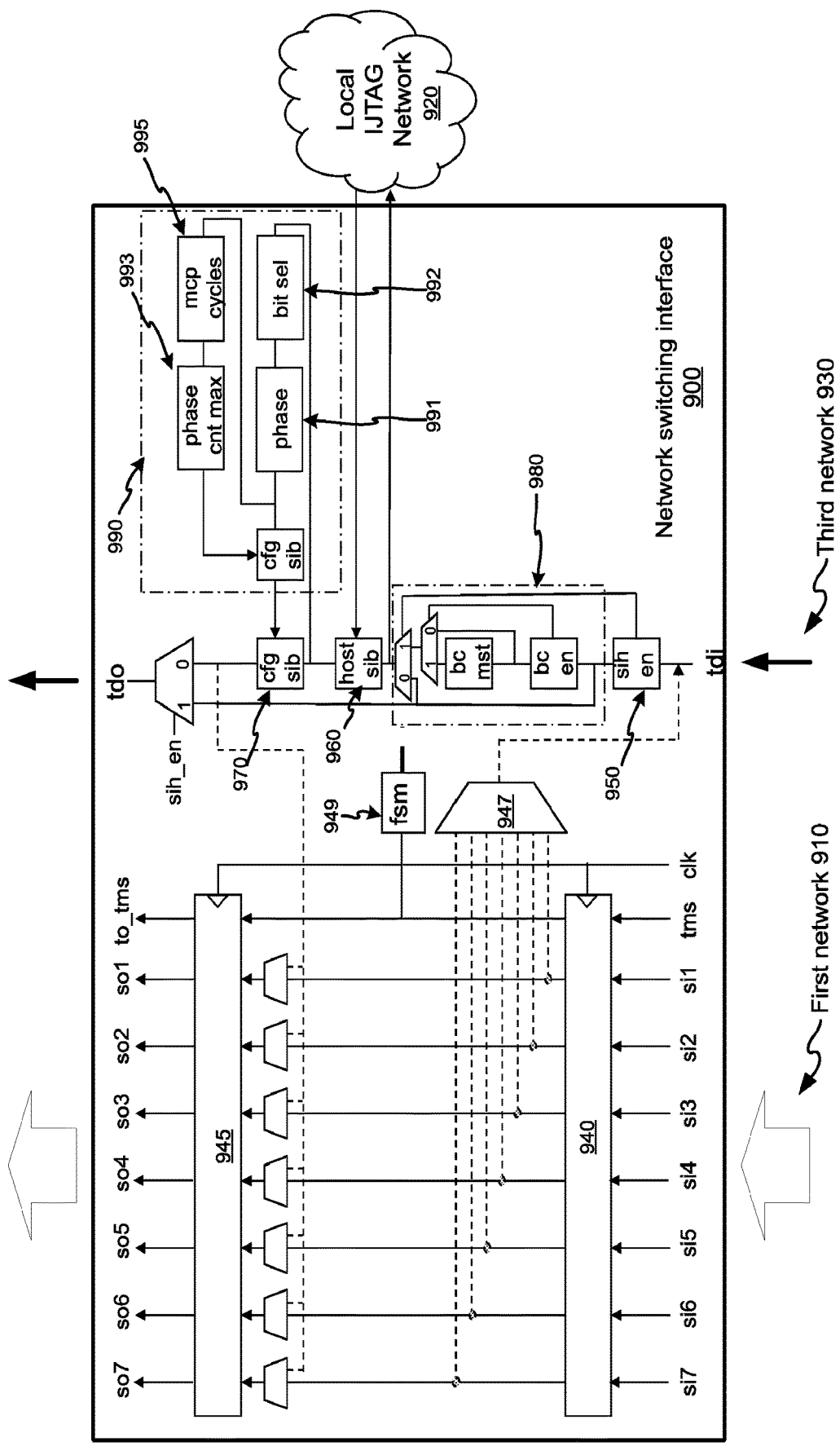
FIG. 9 illustrates an example of a detailed block diagram of a network switching interface device according to various embodiments of the disclosed technology.

FIG. 9 illustrates an example of a detailed block diagram of a network switching interface device 900 according to various embodiments of the disclosed technology. The network switching interface device 900 is configured to couple a local IJTAG network 920 (second network) to either a serial network 930 (third network) or a parallel network 910 (first network) depending on a control bit stored in a SIH enable register 950. The control bit stored in the SIH enable register 950 can be updated via either the first network 910 or the third network 930 depending on the stored bit before the update operation. The first network 910 has eight data channels SiN-SoN (N=0-7). Here, the data channel Si0-So0 is used to transmit a TMS signal (tms) when the local IJTAG network 920 is coupled to the first network 910. The TMS (Test Mode Select) signal is a control signal supplied by a TAP controller conforming to JTAG (Joint Test Action Group, IEEE 1149.1). The network switching interface device 900 can use the TMS signal to drive a finite-state machine (FSM) 949 which controls shift, capture and update operations of data registers. The other seven data channels SiN-SoN (N=1-7) can be used to transmit data into and out of the local IJTAG network 920 when the local IJTAG network 920 is coupled to the first network 910.

The network switching interface device 900 comprises two registers 940 and 945 for the first network 910. Each of the registers 940 and 945 may comprise eight flip-flops, one for each data channel of the first network 910. The two flip-flops in the registers 940 and 945 for each channel are connected in serial, serving as two pipeline stages of the first network 910.

The network switching interface device 900 also comprises a multiplexer device 947, a host SIB 960, a configuration SIB 970, a broadcast control unit 980, and a configuration unit 990. The multiplexer device 947 is configured to select one of the seven data channels SiN-SoN (N=1-7) to be coupled to the local IJTAG network 920. The host SIB 960 and the configuration SIB 970 are typical IJTAG segment insertion bit devices like those shown in FIG. 1. The host SIB 960 determines whether the local IJTAG network 920 is to be bypassed or not. The configuration SIB 970 determines whether the configuration unit 990 is to be bypassed or not. The configuration unit 990 is configured to store control bits including ones determining at which clock cycle (stored in a register 991) and from which data channel of the first network 910 the local IJTAG network 920 receives data (stored in a register 992) and ones representing the ratio between the global clock frequency and the local clock frequency (stored in a register 993). The broadcast control unit 980 is configured to stored control bits for output from the local IJTAG network 920 in the broadcast mode which will be discussed below.

Figure 10:
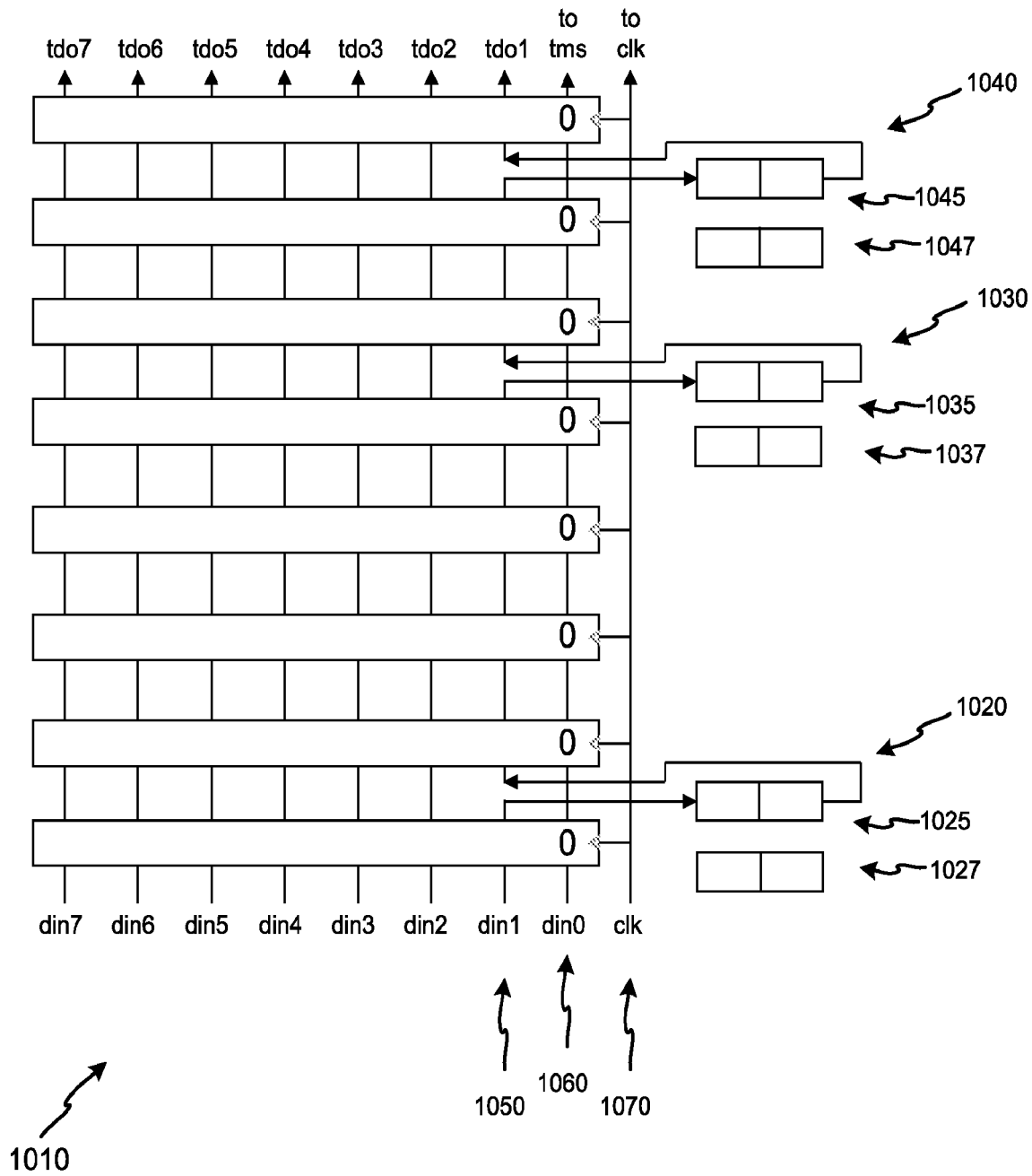
FIG. 10 illustrates an example of a data streaming network coupled to three local serial networks in a daisy chain mode according to various embodiments of the disclosed technology.

When a data streaming network (e.g., the first network 710 in FIG. 7) is coupled to local serial networks (e.g., the second networks 720, 725 and 727 in FIG. 7), at least three modes of coupling can be employed. FIG. 10 illustrates an example of a data streaming network 1010 coupled to three local serial networks 1020, 1030 and 1040 in a daisy chain mode according to various embodiments of the disclosed technology. The data streaming network 1010 has eight data channels. The right-most data channel 1060 is configured to transmit the TMS signal and the second right-most data channel 1050 is configured to transmit data into and out of the three local serial networks 1020, 1030 and 1040. Each of the three local serial networks 1020, 1030 and 1040 has a two-bit shift element (1025, 1035 and 1045). Each of the three two-bit shift elements 1025, 1035 and 1045 is coupled in parallel to a storage element (latch element) (1027, 1037 and 1047). In the daisy chain mode, data bits shifted in the data channel 1050 can be shifted into a local serial network when that local serial network is selected based on the TSM bits shifted in the data channel 1060. The daisy chain mode can also allow data bits captured by a local serial network to be shifted back into the data channel 1050 based on the TSM bits shifted in the data channel 1060.

Figure 11:
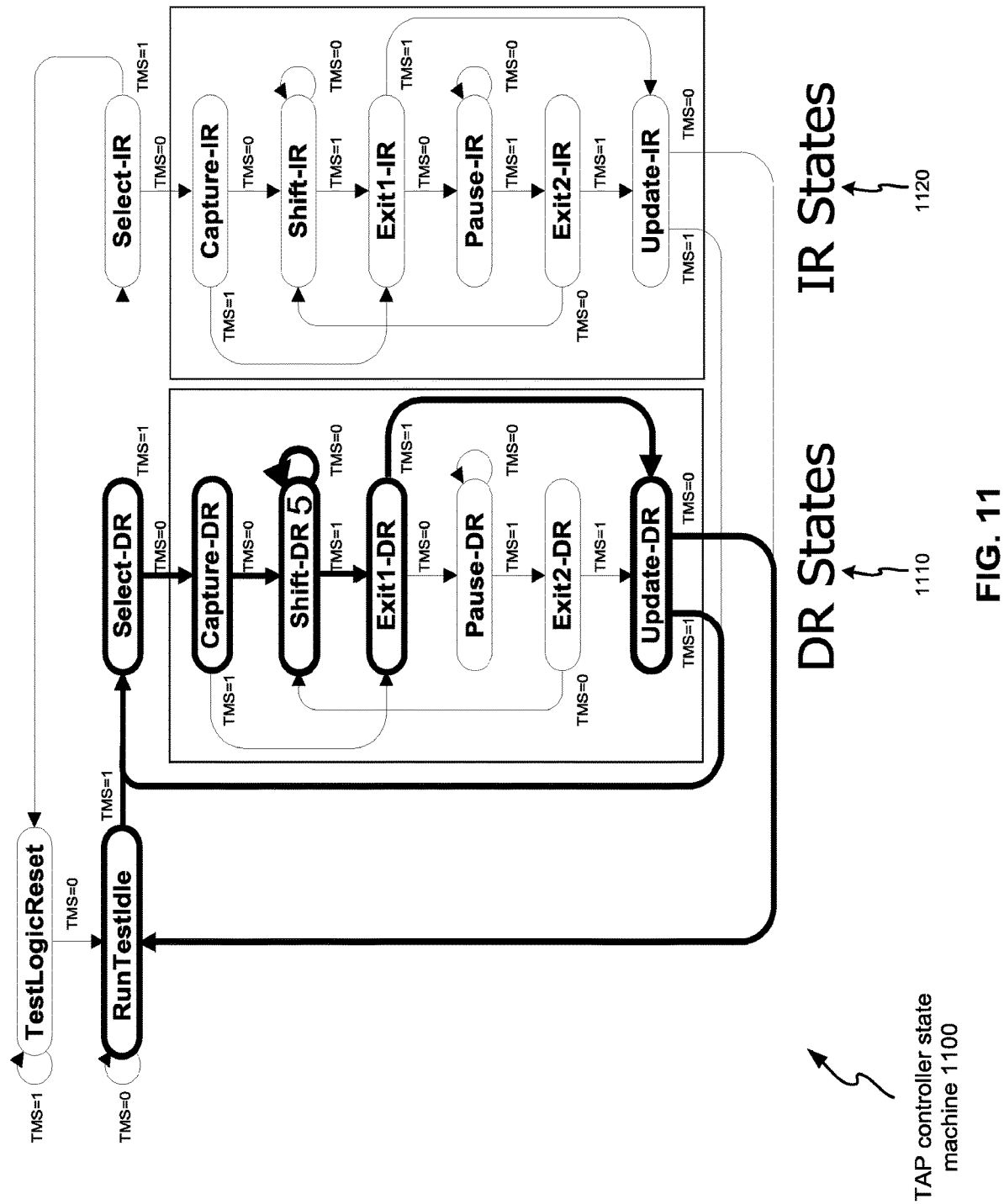
FIG. 11 illustrates an example of a TAP state machine conforming to the IEEE 1149.1-2013 standard.

FIG. 11 illustrates an example of a TAP state machine 1100 conforming to the IEEE 1149.1-2013 standard. The TAP state machine 1100 progresses on the test clock (TCK) edge, with the value of the test mode select (TMS) pin controlling the behavior. Assuming the TAP state machine 1100 begins at Test-Logic-Reset, the test clock moves, when TMS=0, the TAP state machine 1100 into the Run-Test/Idle state, and then moves, when TMS=1, the TAP state machine 1100 into the state of selecting a path, either entering a data register path 1110 or the Select-IR state which can enter an instruction register path 1120. The data register path 1110 includes three important states: Capture-DR, Shift-DR and Update-DR. In the Capture-DR state, the shift element of the data register loads data bits present at their parallel inputs. In the Shift-DR state, the shift element of the data register shifts data bits along the scan path from TDI to TDO. In the Update-DR state, the data bits in the shift element of the data register are latched into the storage element of the data register.

Figure 13:
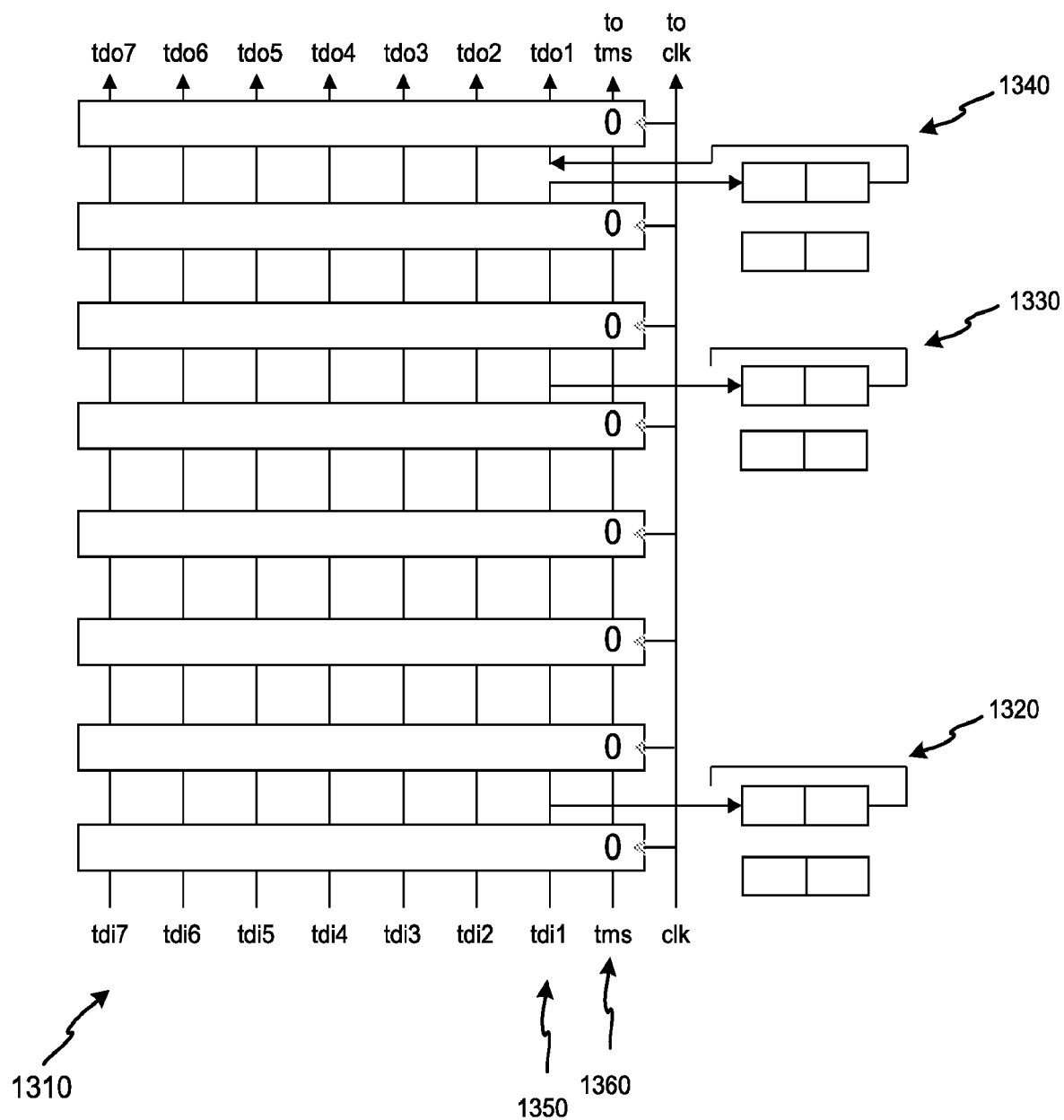
FIG. 13 illustrates an example of a data streaming network coupled to three local serial networks in a broadcast mode according to various embodiments of the disclosed technology.

FIG. 12 illustrates a table 1200 describing an example of bits in some of the scan/storage elements in FIG. 10 at 19 consecutive clock cycles (0-18). The row of TMS indicates a state changing sequence of the TAP state machine for the local serial network 1020: Run-Test/Idle (1)→Select-DR-Scan (0)→Capture-DR (0)→Shift-DR (0)→Shift-DR (0) →Shift-DR (0)→Shift-DR (0)→Shift-DR (0)→Shift-DR (1)→Exit1-DR (1)→Update-DR (1)→Select-DR-Scan (0) →Capture-DR (0)→Shift-DR (0)→Shift-DR (0)→Shift-DR (0)→Shift-DR (0)→Shift-DR (0)→Shift-DR (0). Here, the number in the bracket is the TMS value. The two-bit shift element 1025 captures C5 and C4 at clock cycle 4 and shifts out these values subsequently. Similarly, the two-bit shift element 1035 captures and shifts out C3 and C2, and the two-bit shift element 1045 captures and shifts out C1 and C0. A sequence of "C0 C1 C2 C3 C4 C5" is eventually shifted out via the data streaming network 1010. In the meantime, S5 and S4 are shifted into the two-bit shift element 1025 and then latched into the storage element 1027 at clock cycle 12, S3 and S2 are shifted into the two-bit shift element 1035 and then latched into the storage element 1037 at clock cycle 16, and S1 and S0 are shifted into the two-bit shift element 1045 and then latched into the storage element 1047 at clock cycle 18. FIG. 13 illustrates an example of a data streaming network 1310 coupled to three local serial networks 1320, 1330 and 1340 in a broadcast mode according to various embodiments of the disclosed technology. Similar to the setup shown in FIG. 10, the right-most data channel 1360 of the data streaming network 1310 is configured to transmit the TMS signal and the second right-most data channel 1350 is configured to transmit data into the three local serial networks 1320, 1330 and 1340. Unlike the daisy chain mode, however, local serial networks in the broadcast mode typically receive and latch the same data bits (S1 and S0 for each of the local serial networks 1320, 1330 and 1340 vs. S1 and S0 for the local serial network 1040, S3 and S2 for the local serial network 1030, and S5 and S4 for the local serial network 1020). Moreover, only the last local serial network 1340 captures and shifts out data bits via the data streaming network 1310. The state changing sequence of the TAP state machine can be: Run-Test/Idle (0) →Run-Test/Idle (1)→Select-DR-Scan (0)→Capture-DR (0) →Shift-DR (0)→Shift-DR (1)→Exit1-DR (1)→Update-DR (0)→Run-Test/Idle (0)→Run-Test/Idle (0)→Run-Test/Idle (0) →Run-Test/Idle (0)→Run-Test/Idle (0)→Run-Test/Idle (0)→Run-Test/Idle (0).

Figure 14:
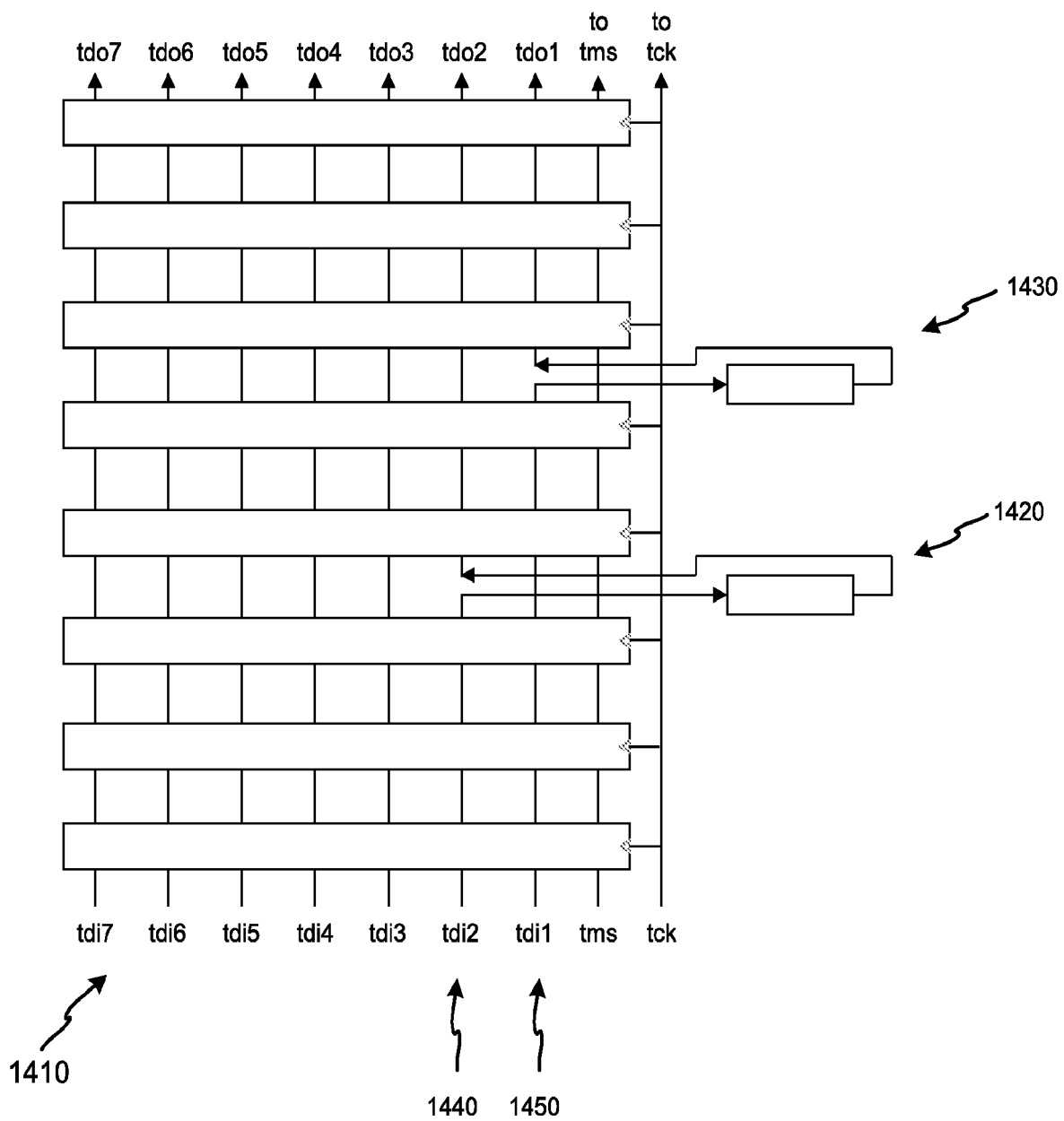
FIG. 14 illustrates an example of a data streaming network coupled to two local serial networks in a parallel mode according to various embodiments of the disclosed technology.

FIG. 14 illustrates an example of a data streaming network 1410 coupled to two local serial networks 1420 and 1430 in a parallel mode according to various embodiments of the disclosed technology. In this setup, a data channel 1440 is configured to transmit data into and out the local serial network 1420, and another data channel 1450 is configured to transmit data into and out the local serial network 1430. The three modes described above (the daisy chain mode, the broadcast mode, and the parallel mode) can be used alone or in any combination according to various embodiments of the disclosed technology. For example, some local networks may be coupled to the data streaming network in the broadcast mode, and the rest of the local networks may be coupled to the data streaming network in the daisy chain mode via a different data channel of the data streaming network.

Figure 15:
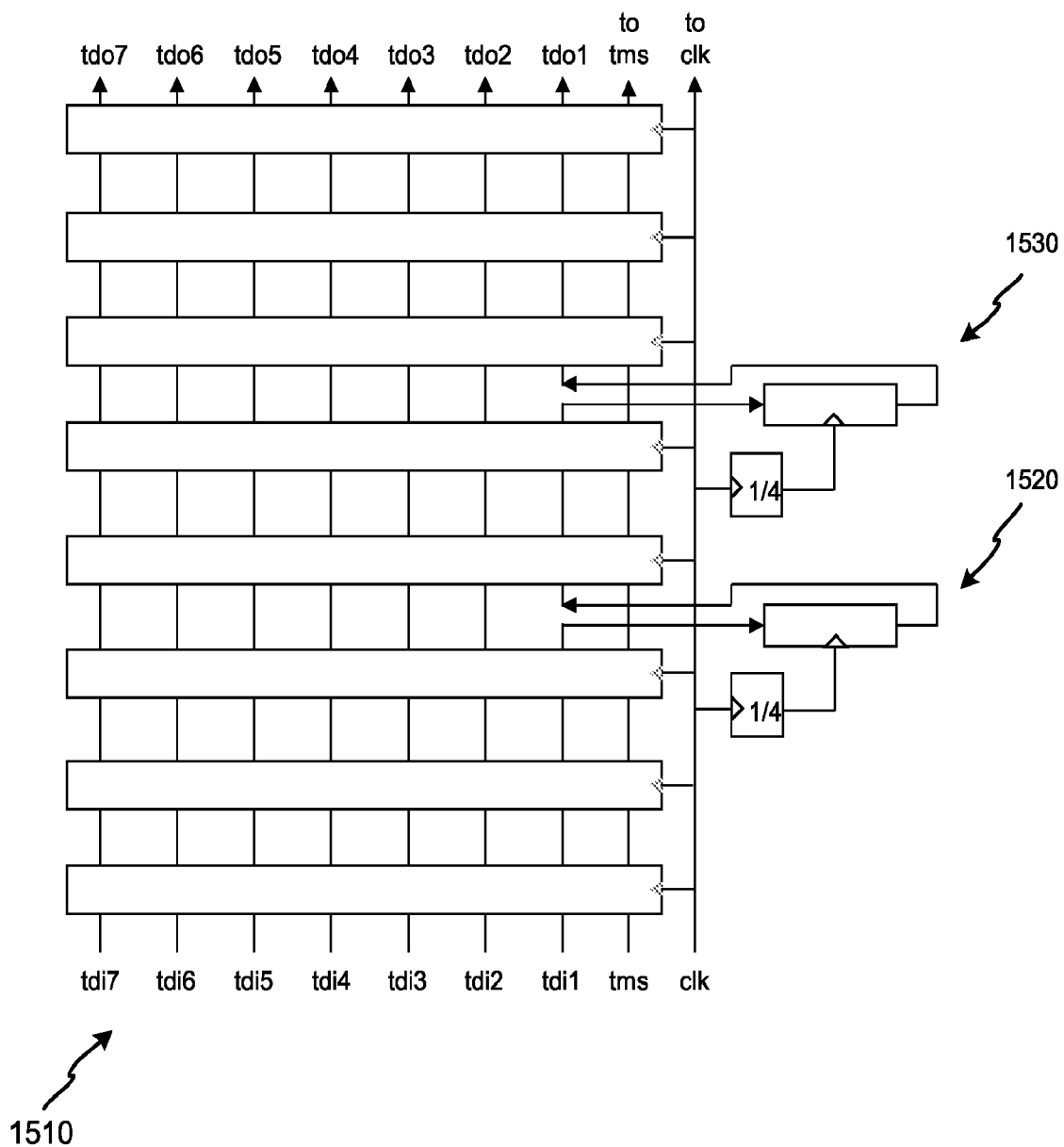
FIG. 15 illustrates an example of a data streaming network coupled to two local serial networks in a time slot multiplexing mode according to various embodiments of the disclosed technology.

FIG. 15 illustrates an example of a data streaming network 1510 coupled to two local serial networks 1520 and 1530 in a time slot multiplexing mode according to various embodiments of the disclosed technology. A data streaming network can typically operate in the high 100 MHz range, while an IJTAG network often operates at 20 MHz due to various limitations. Using some techniques such as clock stretching around some special clock cycles, an IJTAG network can operate in the low 100 MHz range. To match the local IJTAG networks, the data streaming network can operate at a reduced clock speed. When more bandwidth is needed, the time slot multiplexing mode can be used. In the example shown in FIG. 15, the data streaming network 1510 is assumed to operate at 400 MHz while the local serial networks 1520 and 1530 are assumed to operate at 100 MHz. The local serial networks 1520 and 1530 can be preconfigured to scan in a bit once every four bits scanned by the data streaming network 1510. The particular position (referred to as phase) of the bit within every four bits to be scanned in can be programmed as well. In the setup shown in FIG. 15, the phase is the same for the two local serial networks 1520 and 1530. The two local serial networks 1520 and 1530 can operate in a daisy chain mode or a broadcast mode. To use different phases for different local networks, the local networks can be coupled to the data streaming network 1510 in the parallel mode as shown in FIG. 13, i.e., to different data channels of the data streaming network 1510.

Figure 16:
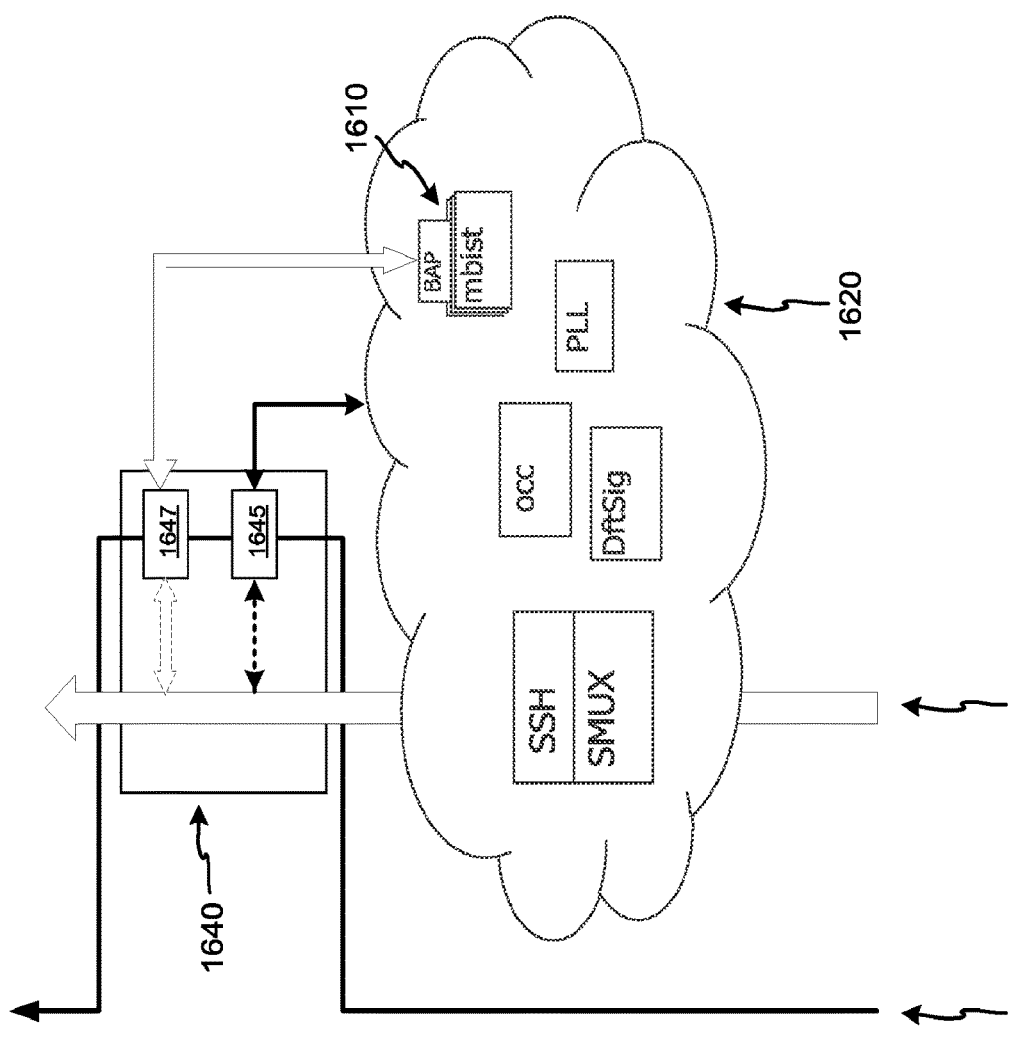
FIG. 16 illustrates an example of a memory BIST (Built-In Self-Test) section of a local network configurable to be coupled to a data streaming network (first network) in parallel according to various embodiments of the disclosed technology.

A local network transmits data mainly in serial. In some situations, a local network may comprise a section configurable to transmit data in parallel. That section can be coupled to the data streaming network in parallel. FIG. 16 illustrates an example of a memory BIST (Built-In Self-Test) section 1610 of a local network 1620 configurable to be coupled to a data streaming network 1630 (first network) in parallel according to various embodiments of the disclosed technology. A network switching interface device 1640 has two devices 1645 and 1647. When the device 1645 couples the local network 1620 to a third network 1650, the memory BIST section 1610 can be accessed via the combined serial network. When the device 1647 couples the local network 1620 to the data streaming network 1630, the device 1647 can couple the memory BIST section 1610 to the data streaming network 1630 in parallel, i.e., to multiple data channels of the data streaming network 1630. This can further increase the bandwidth because multiple memory BIST controllers can be accessed simultaneously.

FIG. 17 illustrates a flowchart 1700 showing a process of setting up a circuit test via a high-bandwidth serial network enabled by a data streaming network that may be implemented according to various examples of the disclosed technology. For ease of understanding, methods for setting up a circuit test via a high-bandwidth serial network enabled by a data streaming network that may be employed according to various embodiments of the disclosed technology will be described with reference to the system 700 in FIG. 7 and the flow chart 1700 illustrated in FIG. 17. It should be appreciated, however, that alternate implementations of a system that utilizes a data streaming network to increase serial network bandwidth may be used to perform the methods for setting up a circuit test via a high-bandwidth serial network enabled by a data streaming network illustrated by the flow chart 1700 according to various embodiments of the disclosed technology. Likewise, the system 700 may be employed to perform other methods for setting up a circuit test via a high-bandwidth serial network enabled by a data streaming network according to various embodiments of the disclosed technology.

In operation 1710 of the flow chart 1700, network configuration data are transmitted via the third network 730 being coupled to the plurality of second networks including the second networks 720, 725 and 727. The network configuration data comprise first network switching interface control data for the plurality of network switching interface devices including network switching interface devices 740, 745 and 747. The first network switching interface control data enables each of the plurality of network switching interface devices to decouple one of the plurality of second networks from the third network 730 and to couple the one of the plurality of second networks to the first network 710. The network configuration data may further comprise network reconfiguration data for a plurality of multiplexing devices. The network reconfiguration data can cause the first network 710 to bypass zero, one, or more of the circuit blocks. The plurality of second networks are reconfigurable and are initially configured to bypass most of the devices other than those for enabling the plurality of network switching interface devices and may be the multiplexing devices. As a result, the speed of the data transmission is not too slow even though the third network 730 is used.

In operation 1720, setup data are transmitted via the first network 710 being coupled to the plurality of second networks including the second networks 720, 725 and 727. The setup data comprise test setup data for the circuit blocks, the network setup data for communication between the first network and the circuit blocks, and second network switching interface control data for the plurality of network switching interface devices. The test setup data may comprise data for setting up various test controllers, on-chip clock controllers, phase-locked loop (PLL) clock generators, or any combination thereof. The network setup data may be used for setting up devices such as the circuit block interface devices (e.g., the first interface devices 225 shown in FIG. 2). The speed of the data transmission increases significantly via the first network 710 compared to via the third network 730 especially considering the volume of data transmitted. The second network switching interface control data enable, after the setup, each of the plurality of network switching interface devices to decouple one of the plurality of second networks from the first network 710 and to couple the one of the plurality of second networks to the third network 730.

Optionally in operation 1730, interface enabling data are transmitted via the third network 730 being coupled to the plurality of second networks to enable the circuit block interface devices in the first network 710 before transmitting test data. To ensure proper operation of some types of the first network 710, the first network 710 should be idle before the circuit block interface devices are turned on.

In operation 1740, test data are transmitted to the circuit blocks via the first network 710. The circuit blocks can then be tested.

Figure 18:
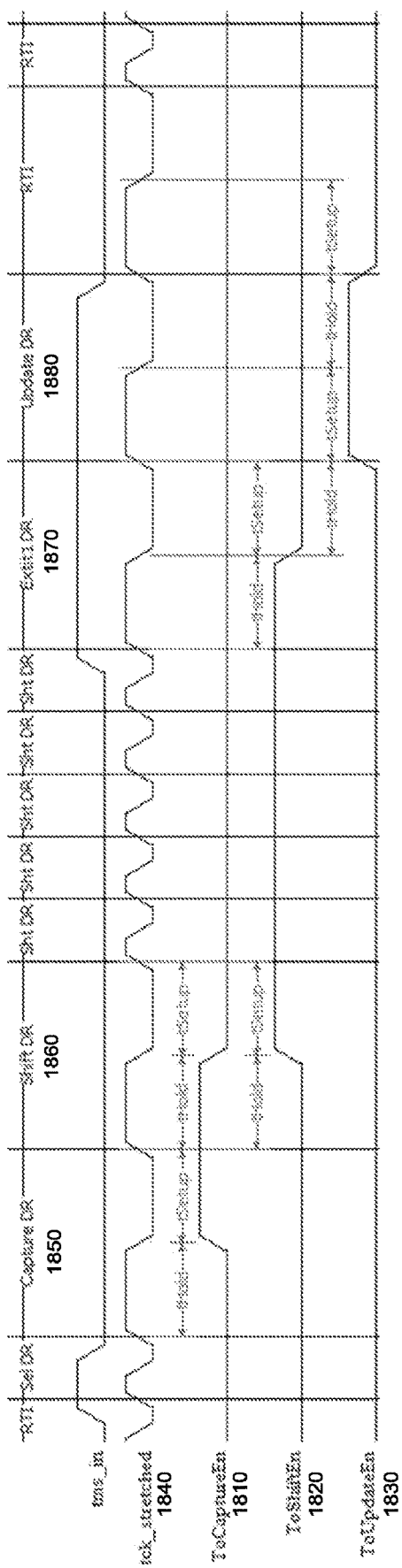
FIG. 18 illustrates an example of waveforms of some clock and control signals describing a clock stretching technique for increasing the shift speed of an IJTAG network that may be implemented according to various embodiments of the disclosed technology.

The disclosed technology can allow local networks in circuit blocks not only to benefit from the parallel nature and high speed capability of a data streaming network in the circuit, but to increase their own operation speed by using a clock stretching technique while being pipelined. FIG. 18 illustrates an example of waveforms of some clock and control signals describing a clock stretching technique. To meet the timing requirement of some clock control signals, a clock for an IJTAG network typically runs slower than 100 MHz. However, this limitation can be mitigated significantly by increasing the clock frequency when no control signals are transitioning. As FIG. 18 shows, a ToCaptureEn signal 1810 and a ToShiftEn signal 1820 are transitioning during a Capture DR state 1850 and a Shift DR state 1860 immediately following the Capture DR state 1850, and the ToShiftEn signal 1820 and a ToUpdateEn signal 1830 are transitioning during an Exit1 DR state 1870 and an Update DR state 1880. Therefore, a tck_stretched clock signal 1840 only needs to be stretched for the four state. In the figure, it is stretched to run at a speed three times slower. It should be noted that FIG. 18 is just an example and that the clock may be stretched to run at a speed faster or slower than what is shown.

Stretching a global clock 1070 in FIG. 10 is not feasible because the local serial networks 1020, 1030 and 1040 are pipelined and do not change to the same states simultaneously. On the other hand, the locally-generated clocks for these local serial networks 1020, 1030 and 1040 can be stretched for the Capture DR state, the Shift DR state immediately following the Capture DR state, the Exit1 DR state, and the Update DR state while the global clock 1070 keeps running. As a result, each local serial network can operate at a shift rate of 200 MHz or more with various implementations of the disclosed technology, which is much faster than a typical IJTAG network in a large circuit. A register 995 in the configuration unit 990 in FIG. 9 can be used to store a control signal determining the number of clock cycles to be stretched for those four states.

Illustrative Computing Environment

Figure 19:
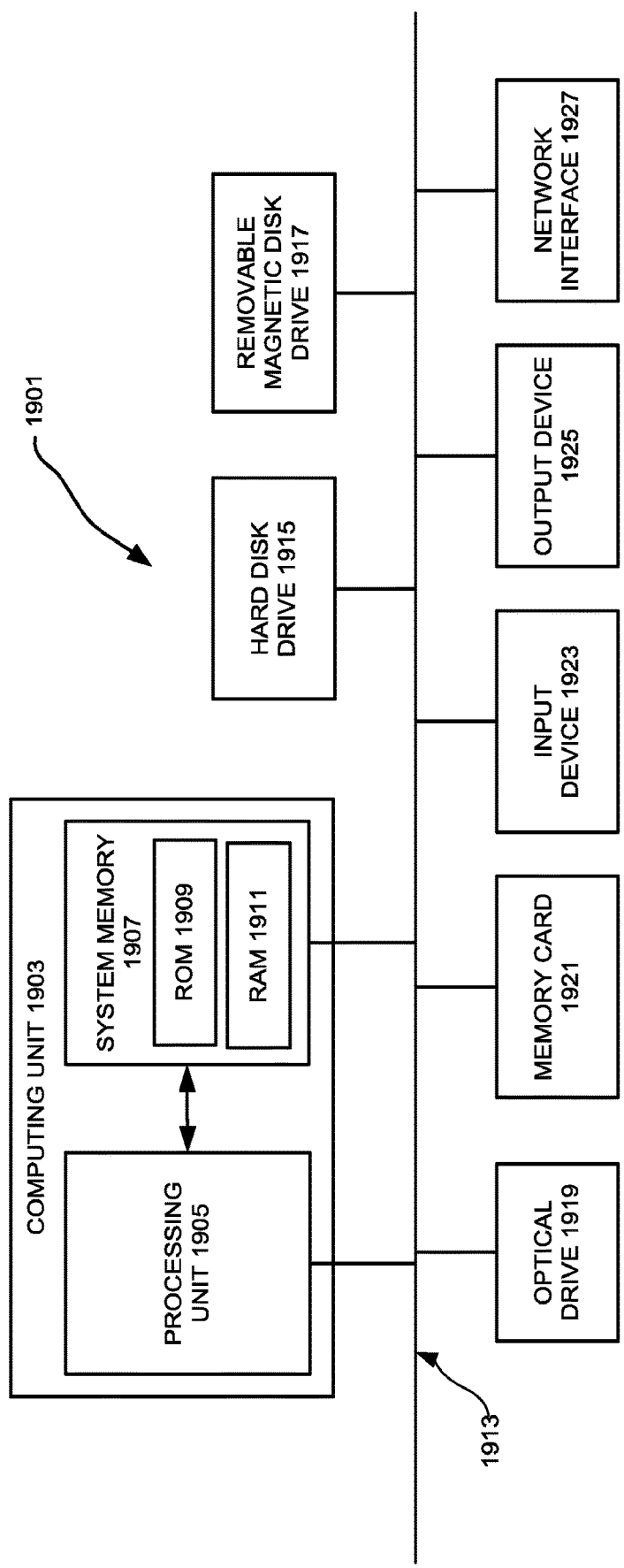
FIG. 19 illustrates a programmable computer system with which various embodiments of the disclosed technology may be employed.

Some embodiments of the disclosed technology related to generating a system of streaming data in a circuit design may be implemented through the execution of software instructions by a computing device, such as a programmable computer. FIG. 19 shows an illustrative example of such a programmable computer (a computing device 1901). As seen in this figure, the computing device 1901 includes a computing unit 1903 with a processing unit 1905 and a system memory 1907. The processing unit 1905 may be any type of programmable electronic device for executing software instructions, but will conventionally be a microprocessor. The system memory 1907 may include both a read-only memory (ROM) 1909 and a random access memory (RAM) 1911. As will be appreciated by those of ordinary skill in the art, both the read-only memory (ROM) 1909 and the random access memory (RAM) 1911 may store software instructions for execution by the processing unit 1905.

The processing unit 1905 and the system memory 1907 are connected, either directly or indirectly, through a bus 1913 or alternate communication structure, to one or more peripheral devices. For example, the processing unit 1905 or the system memory 1907 may be directly or indirectly connected to one or more additional memory storage devices, such as a "hard" magnetic disk drive 1915, a removable magnetic disk drive 1917, an optical disk drive 1919, or a flash memory card 1921. The processing unit 1905 and the system memory 1907 also may be directly or indirectly connected to one or more input devices 1923 and one or more output devices 1925. The input devices 1923 may include, for example, a keyboard, a pointing device (such as a mouse, touchpad, stylus, trackball, or joystick), a scanner, a camera, and a microphone. The output devices 1925 may include, for example, a monitor display, a printer and speakers. With various examples of the computer 1901, one or more of the peripheral devices 1915-1925 may be internally housed with the computing unit 1903. Alternately, one or more of the peripheral devices 1915-1925 may be external to the housing for the computing unit 1903 and connected to the bus 1913 through, for example, a Universal Serial Bus (USB) connection.

With some implementations, the computing unit 1903 may be directly or indirectly connected to one or more network interfaces 1927 for communicating with other devices making up a network. The network interface 1927 translates data and control signals from the computing unit 1903 into network messages according to one or more communication protocols, such as the transmission control protocol (TCP) and the Internet protocol (IP). Also, the interface 1927 may employ any suitable connection agent (or combination of agents) for connecting to a network, including, for example, a wireless transceiver, a modem, or an Ethernet connection. Such network interfaces and protocols are well known in the art, and thus will not be discussed here in more detail.

It should be appreciated that the computer 1901 is illustrated as an example only, and it not intended to be limiting.

Various embodiments of the disclosed technology may be implemented using one or more computing devices that include the components of the computer 1901 illustrated in FIG. 19, which include only a subset of the components illustrated in FIG. 19, or which include an alternate combination of components, including components that are not shown in FIG. 19. For example, various embodiments of the disclosed technology may be implemented using a multi-processor computer, a plurality of single and/or multiprocessor computers arranged into a network, or some combination of both.

CONCLUSION

While the disclosed technology has been described with respect to specific examples including presently preferred modes of carrying out the disclosed technology, those skilled in the art will appreciate that there are numerous variations and permutations of the above described systems and technology that fall within the spirit and scope of the disclosed technology as set forth in the appended claims. For example, while the data streaming network shown in FIG. 2 has been employed to describe the disclosed technology, it should be appreciated that other parallel network may be utilized to increase the serial network bandwidth.

What is claimed is:

1. A system in a circuit, comprising:
a first network configured to transmit data in parallel in the circuit, the first network comprising circuit block interface devices, each of the circuit block interface devices being coupled to ports of one of circuit blocks in the circuit;
a plurality of second networks, each of the plurality of second networks configured to transmit data in one of the circuit blocks in the circuit;
a third network configured to transmit data in serial in the circuit when being coupled to the plurality of second networks; and
a plurality of network switching interface devices, each of the plurality of network switching interface devices being configured to couple either the first network or the third network to one of the plurality of second networks based on a control signal stored in the each of the plurality of network switching interface devices.

2. The system recited in claim 1, wherein the control signal stored in the each of the plurality of network switching interface devices is updated using either the third network when the third network is coupled to the one of the plurality of second networks or the first network when the first network is coupled to the one of the plurality of second networks.

3. The system recited in claim 1, wherein some or all of the plurality of second networks are configured to be coupled to the first network in one of a daisy chain mode, a parallel mode, and a broadcast mode.

4. The system recited in claim 1, wherein the first network operates at a clock frequency being a multiple (greater than 1) of a clock frequency at which the plurality of second networks operates, and the plurality of second networks are coupled to the first network in a time slot multiplexing mode.

5. The system recited in claim 1, wherein a second network in the plurality of second networks comprises a section configured to transmit data in parallel which is configured to be coupled to the first network in parallel.

6. The system recited in claim 1, wherein one or more second networks in the plurality of second networks employ a clock stretching technique to increase shift speed of the one or more second networks.

7. The system recited in claim 1, wherein the third network and the plurality of second networks conform to the IEEE 1687 standard (IJTAG, Internal Joint Test Action Group).

8. The system recited in claim 1, wherein the first network further comprises multiplexing devices, pipeline devices, or both, the multiplexing devices being configured to change a data streaming path of the first network based on another control signal delivered to the multiplexing devices through the plurality of second networks being coupled to either the first network or the third network.

9. The system recited in claim 1, wherein each of the plurality of second networks comprises a configuration interface device, the configuration interface device being coupled to one of the circuit block interface devices, configuration data for the configuration interface device delivered through the each of the plurality of second networks being coupled to either the first network or the third network, the configuration data comprising data for determining whether or not a circuit block interface device in the circuit block interface devices is activated and data for determining which part of the data transmitted in the first network to be captured, replaced, or captured and replaced by each of the circuit block interface devices activated.

10. The system recited in claim 1, wherein the circuit block interface devices comprises registers and clock signal generation logic, and the first network comprises data channels and is configured to transmit a plurality of data packets consecutively, each of the plurality of data packets having a plurality of bits, each of the plurality of bits being assigned to one of the circuit blocks in which the circuit block interface device is activated, a number of the plurality of bits being equal to or greater than a number of the data channels used for the transmitting the plurality of data packets.

11. The system recited in claim 10, wherein each of the plurality of data packets comprises one or more bits of a test pattern or a compressed test pattern for testing one or more of the circuit blocks, the clock signal generation logic in a circuit block interface device coupled to ports of one of the circuit blocks is configured to generate clock signals for scan-based testing, and the ports of the one of the circuit blocks comprise inputs and outputs of scan chains, or inputs and outputs of one or more test controllers, each of the one or more test controllers comprising a decompressor and a compactor.

12. A method for testing a circuit, comprising:
transmitting network configuration data via a third network being coupled to a plurality of second networks, the third network configured to transmit data in serial in the circuit, each of the plurality of second networks configured to transmit data in one of circuit blocks in the circuit, the network configuration data comprising first network switching interface control data for a plurality of network switching interface devices, the first network switching interface control data enabling each of the plurality of network switching interface devices to decouple one of the plurality of second networks from the third network and to couple the one of the plurality of second networks to a first network, the first network configured to transmit data in parallel in the circuit;
transmitting setup data via the first network being coupled to the plurality of second networks, the setup data comprising test setup data for the circuit blocks, network setup data for communication between the first network and the circuit blocks, and second network switching interface control data for the plurality of network switching interface devices, the second network switching interface control data enabling each of the plurality of network switching interface devices to decouple one of the plurality of second networks from the first network and to couple the one of the plurality of second networks to the third network; and transmitting test data to the circuit blocks via the first network.

13. The method recited in claim 12, wherein the network configuration data further comprise network reconfiguration data for a plurality of multiplexing devices, the network reconfiguration data causing the first network to bypass zero, one, or more of the circuit blocks.

14. The method recited in claim 12, further comprising:
transmitting interface enabling data via the third network being coupled to the plurality of second networks to enable circuit block interface devices between the first network and the circuit blocks before the transmitting test data.

15. One or more non-transitory computer-readable media storing computer-executable instructions for causing a computer to perform a method, the method comprising:
generating, in a circuit design, a system, the system comprising:
a first network configured to transmit data in parallel in the circuit, the first network comprising circuit block interface devices, each of the circuit block interface devices being coupled to ports of one of circuit blocks in the circuit;
a plurality of second networks, each of the plurality of second networks configured to transmit data in one of the circuit blocks in the circuit;
a third network configured to transmit data in serial in the circuit when being coupled to the plurality of second networks; and
a plurality of network switching interface devices, each of the plurality of network switching interface devices configurable-being configured to couple either the first network or the third network to one of the plurality of second networks based on a control signal stored in the each of the plurality of network switching interface devices.

16. The one or more non-transitory computer-readable media recited in claim 15, wherein the control signal stored in the each of the plurality of network switching interface devices is updated using either the third network when the third network is coupled to the one of the plurality of second networks or the first network when the first network is coupled to the one of the plurality of second networks.

17. The one or more non-transitory computer-readable media recited in claim 15, wherein some or all of the plurality of second networks are configured to be coupled to the first network in one of a daisy chain mode, a parallel mode, and a broadcast mode.

18. The one or more non-transitory computer-readable media recited in claim 15, wherein the first network operates at a clock frequency being a multiple (greater than 1) of a clock frequency at which the plurality of second networks operates, and the plurality of second networks are coupled to the first network in a time slot multiplexing mode.

19. The one or more non-transitory computer-readable media recited in claim 15, wherein a second network in the plurality of second networks comprises a section configured to transmit data in parallel which is configured to be coupled to the first network in parallel.

20. The one or more non-transitory computer-readable media recited in claim 15, wherein one or more second networks in the plurality of second networks employ a clock stretching technique for increasing shift speed of the one or more second networks.

21. The one or more non-transitory computer-readable media recited in claim 15, wherein the third network and the plurality of second networks conform to the IEEE 1687 standard (IJTAG, Internal Joint Test Action Group).

22. The one or more non-transitory computer-readable media recited in claim 15, wherein the first network further comprises multiplexing devices, pipeline devices, or both, the multiplexing devices configured to change a data streaming path of the first network based on another control signal delivered to the multiplexing devices through the plurality of second networks being coupled to either the first network or the third network.

23. The one or more non-transitory computer-readable media recited in claim 15, wherein each of the plurality of second networks comprises a configuration interface device, the configuration interface device being coupled to one of the circuit block interface devices, configuration data for the configuration interface device delivered through the each of the plurality of second networks being coupled to either the first network or the third network, the configuration data comprising data for determining whether or not a circuit block interface device in the circuit block interface devices is activated and data for determining which part of the data transmitted in the first network to be captured, replaced, or captured and replaced by each of the circuit block interface devices activated.

24. The one or more non-transitory computer-readable media recited in claim 15, wherein the circuit block interface devices comprises registers and clock signal generation logic, and the first network comprises data channels and is configured to transmit a plurality of data packets consecutively, each of the plurality of data packets having a plurality of bits, each of the plurality of bits being assigned to one of the circuit blocks in which the circuit block interface device is activated, a number of the plurality of bits being equal to or greater than a number of the data channels used for the transmitting the plurality of data packets.

25. The one or more non-transitory computer-readable media recited in claim 24, wherein each of the plurality of data packets comprises one or more bits of a test pattern or a compressed test pattern for testing one or more of the circuit blocks, the clock signal generation logic in a circuit block interface device coupled to ports of one of the circuit blocks is configured to generate clock signals for scan-based testing, and the ports of the one of the circuit blocks comprise inputs and outputs of scan chains, inputs and outputs of one or more test controllers, or a combination thereof, each of the one or more test controllers comprising a decompressor and a compactor.

\* \* \* \* \*